(12) United States Patent
Hirano

(10) Patent No.: US 7,804,132 B2
(45) Date of Patent: Sep. 28, 2010

(54) SEMICONDUCTOR DEVICE

(75) Inventor: Yuichi Hirano, Tokyo (JP)

(73) Assignee: Renesas Technology Corp., Tokyo (JP)

(*) Notice: Subject to any disclaimer, the term of this patent is extended or adjusted under 35 U.S.C. 154(b) by 535 days.

(21) Appl. No.: 11/733,454

(22) Filed: Apr. 10, 2007

(65) Prior Publication Data
US 2007/0241402 A1 Oct. 18, 2007

(30) Foreign Application Priority Data
Apr. 12, 2006 (JP) ............................. 2006-109713

(51) Int. Cl.
*H01L 27/12* (2006.01)
(52) U.S. Cl. .................. 257/347; 257/350; 257/351; 257/371; 257/513; 257/544; 257/E27.098; 257/E27.112
(58) Field of Classification Search ............. 257/347, 257/371, 350–351, 513, 544
See application file for complete search history.

(56) References Cited
U.S. PATENT DOCUMENTS

| | | | | |
|---|---|---|---|---|
| 5,652,454 A | * | 7/1997 | Iwamatsu et al. | 257/350 |
| 6,020,222 A | * | 2/2000 | Wollesen | 438/149 |
| 6,177,300 B1 | * | 1/2001 | Houston et al. | 438/149 |
| 2002/0090764 A1 | * | 7/2002 | Maeda et al. | 438/149 |
| 2002/0105032 A1 | * | 8/2002 | Lee et al. | 257/349 |
| 2007/0111409 A1 | * | 5/2007 | Watanabe et al. | 438/152 |
| 2007/0176233 A1 | * | 8/2007 | Ozawa et al. | 257/335 |

FOREIGN PATENT DOCUMENTS

JP 2005-93875 4/2005

* cited by examiner

*Primary Examiner*—A. Sefer
(74) *Attorney, Agent, or Firm*—Oblon, Spivak, McClelland, Maier & Neustadt, L.L.P.

(57) ABSTRACT

A gate electrode is provided such that both ends thereof in a gate width direction are projected from an active region in plane view. Partial trench isolation insulation films are provided in a surface of an SOI substrate corresponding to lower parts of the both ends, and body contact regions are provided in the surface of the SOI substrate outside the both ends of the gate electrode in the gate width direction so as to be adjacent to the respective partial trench isolation insulation films. The body contact region and a body region are electrically connected through an SOI layer (well region) under the partial trench isolation insulation film. In addition, a source tie region in which P type impurity is doped in a relatively high concentration is provided in the surface of a source region in the vicinity of the center of the gate electrode in the gate width direction.

8 Claims, 20 Drawing Sheets

F I G . 1
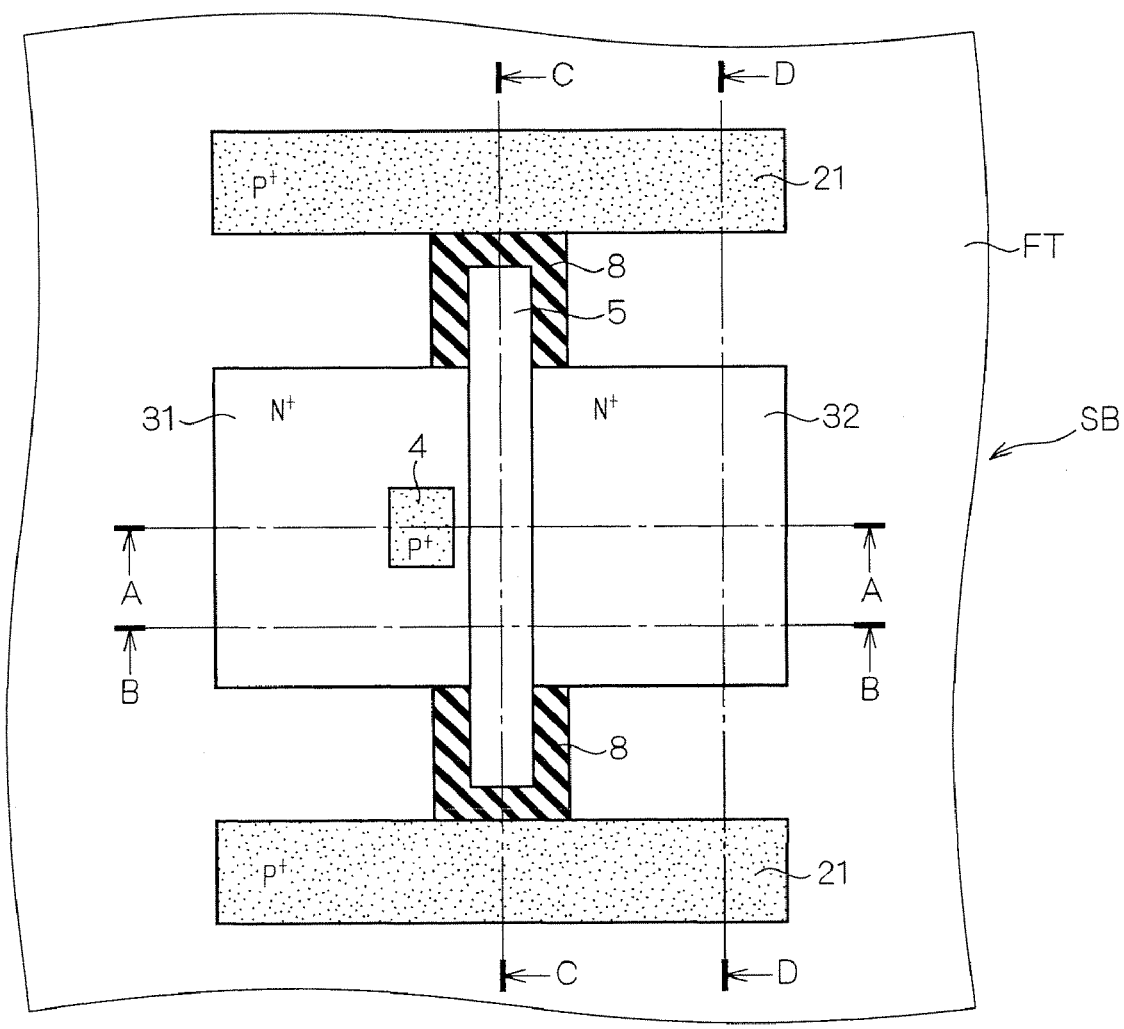

F I G. 2
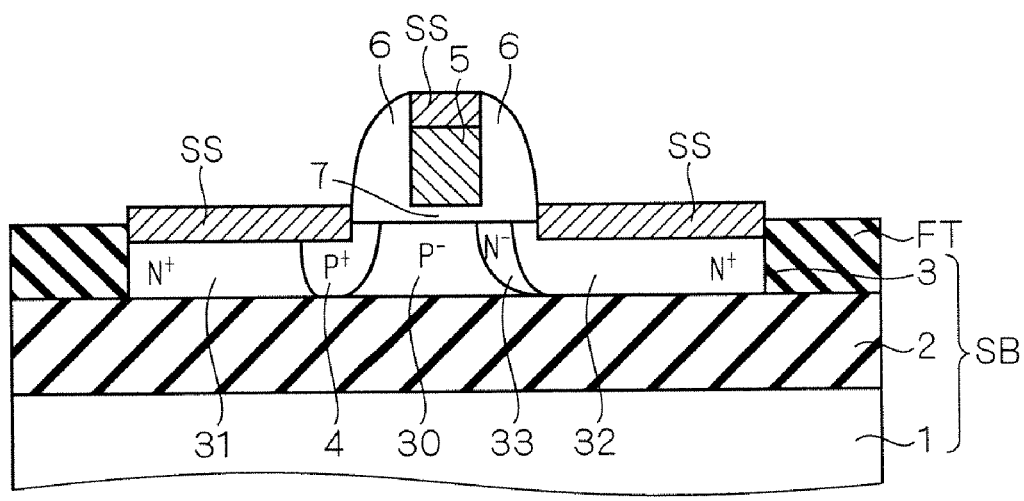
F I G. 3
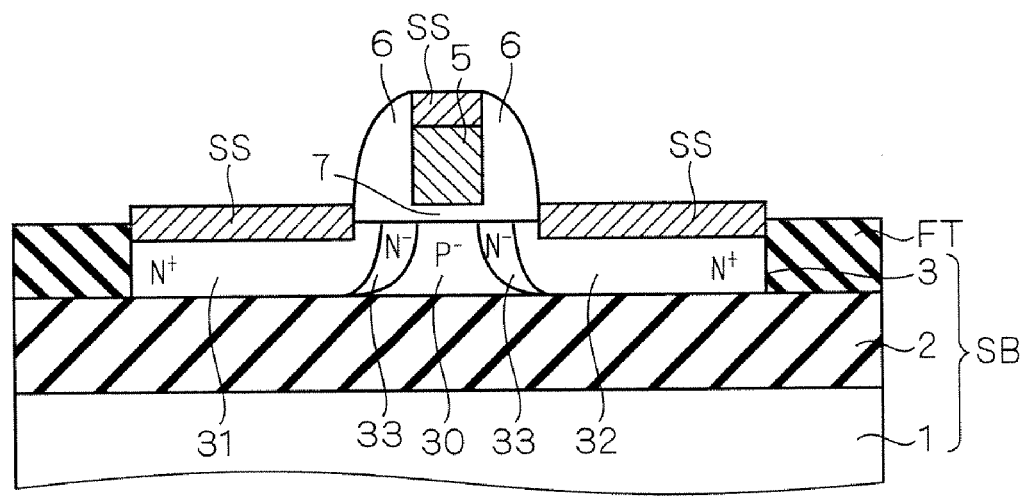

F I G. 4
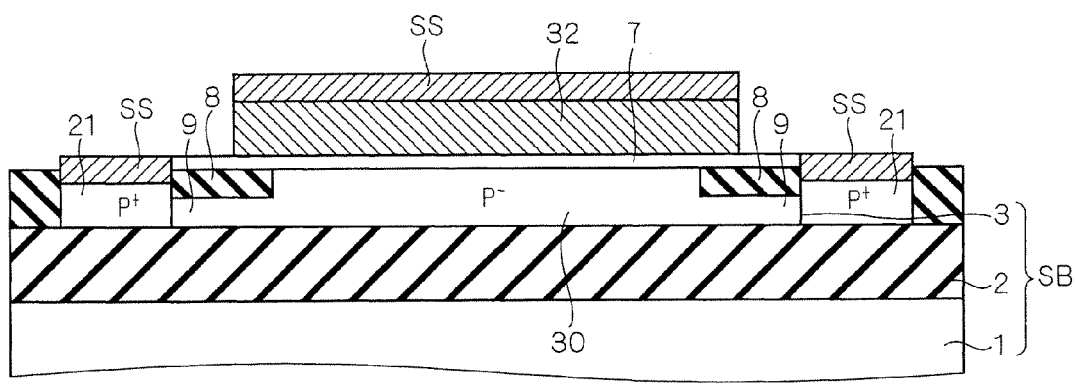
F I G. 5
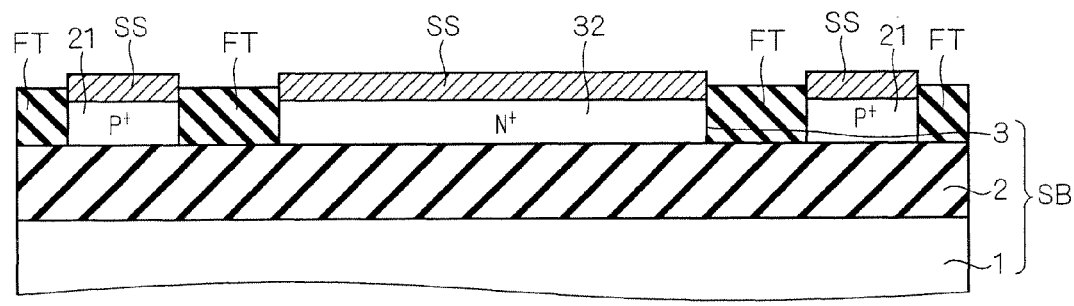

F I G. 1 0
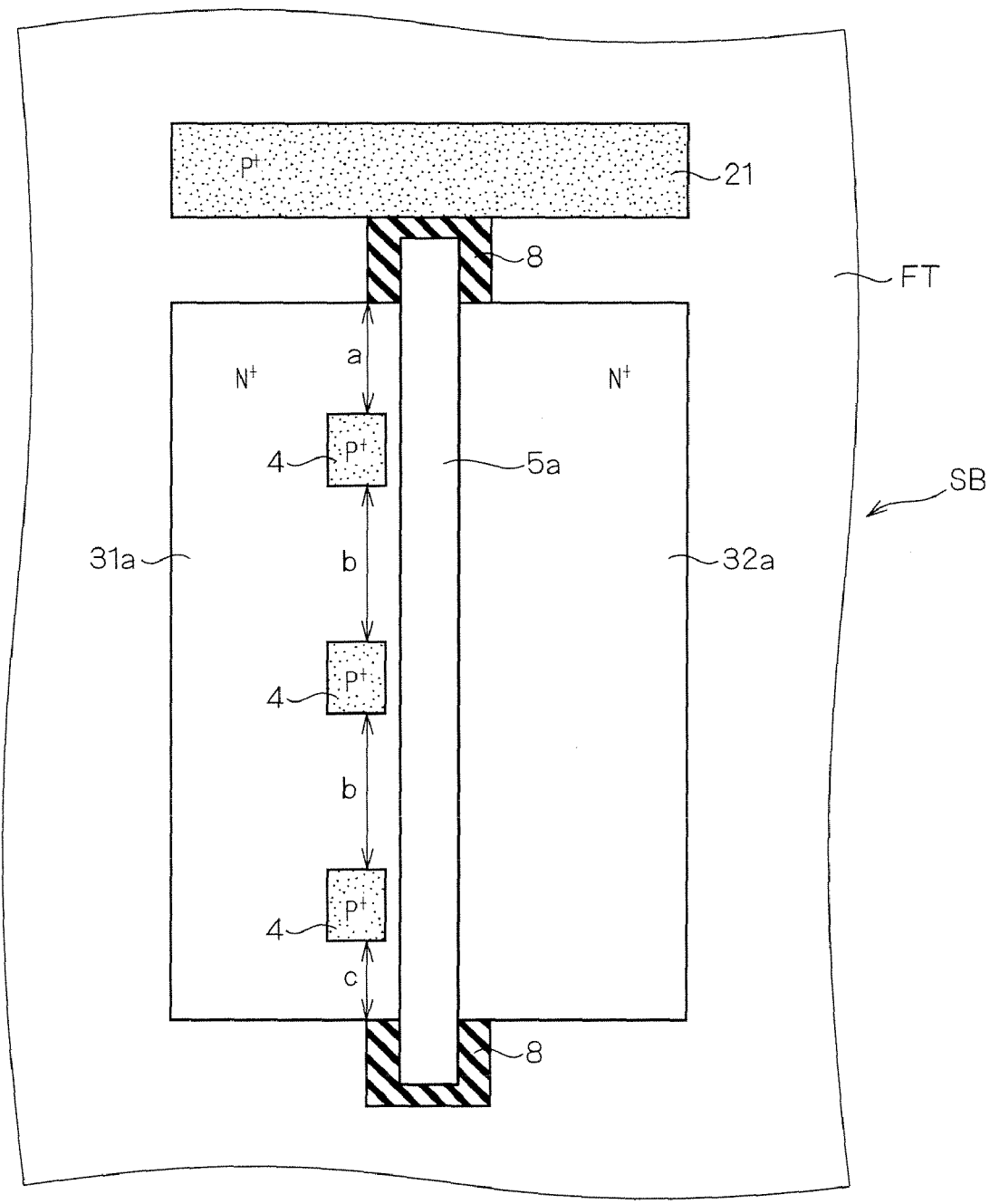

F I G . 1 3
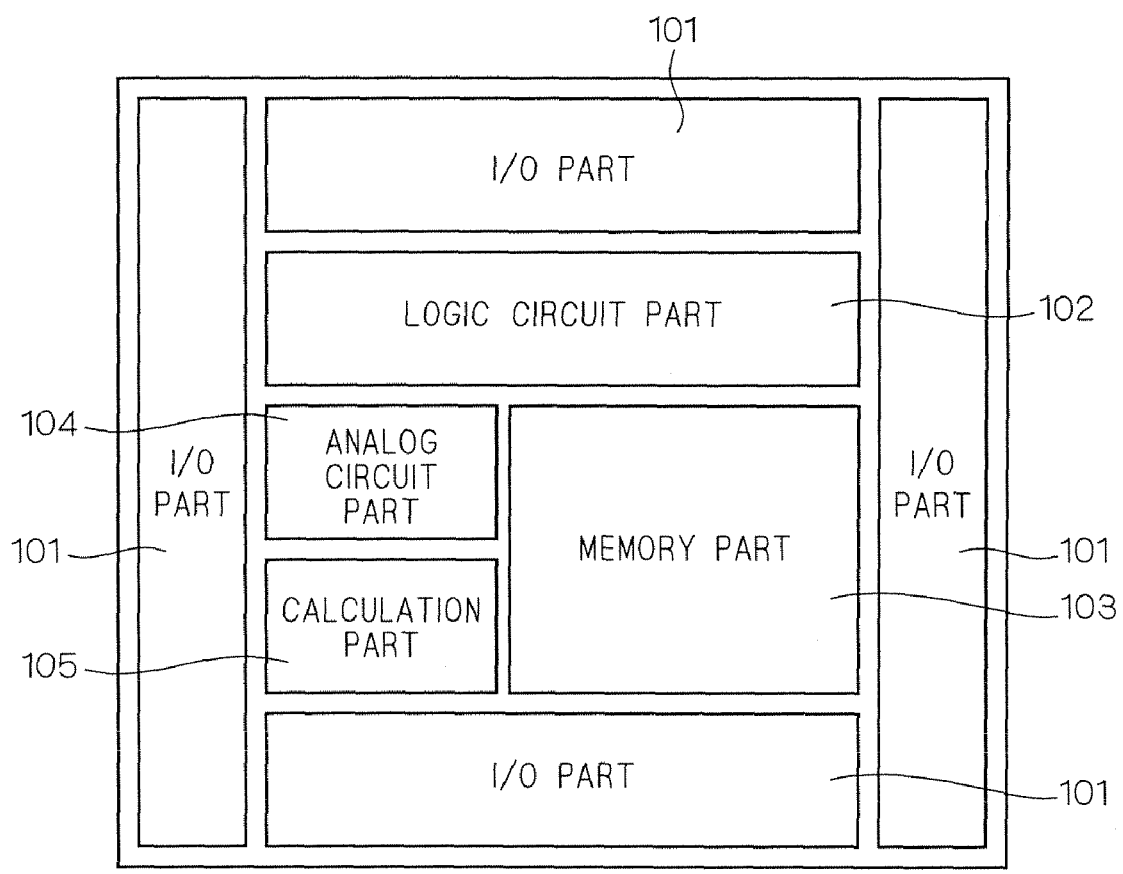

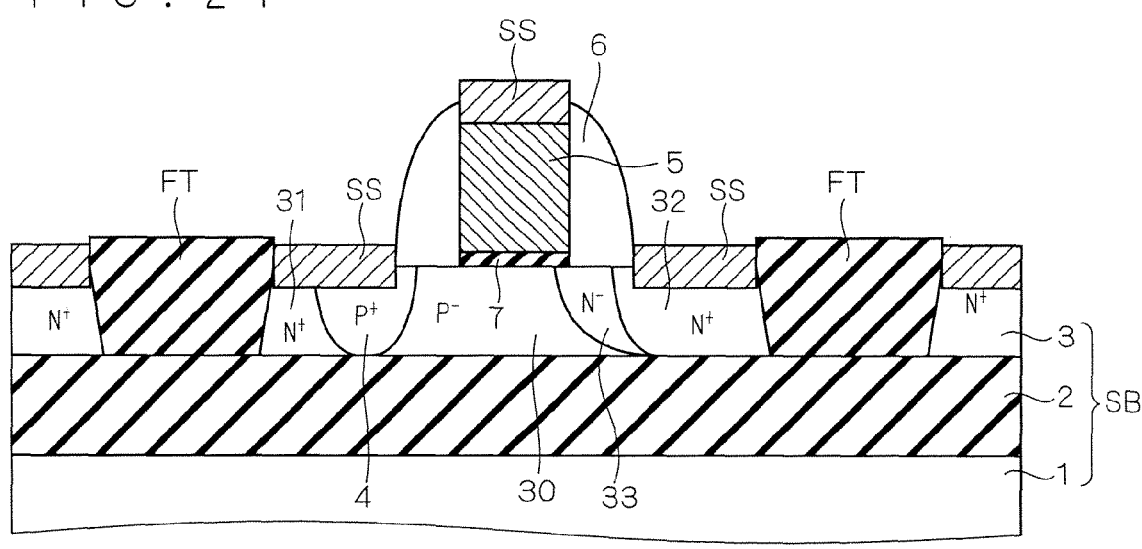
F I G . 2 7

SEMICONDUCTOR DEVICE

BACKGROUND OF THE INVENTION

1. Field of the Invention

The present invention relates to a semiconductor device using an SOI (Silicon On Insulator) substrate, and more particularly, to a semiconductor device having means for fixing a body potential.

2. Description of the Background Art

A semiconductor device formed on an SOI substrate in which a buried oxide film and an SOI (Silicon On Insulator) layer are sequentially formed on a silicon substrate, that is, an SOI device is characterized in that parasitic capacity can be reduced, and high-speed and stable operation and low power consumption can be implemented, and has been used in a mobile device.

The SOI device includes an SOI device having a FTI structure in which an element is electrically isolated from each other by a full trench isolation (FTI) insulation film formed by providing a trench reaching the buried oxide film in the surface of the SOI layer and burying an insulator in the trench.

However, a carrier (hole or electron) generated by a collisional ionization phenomenon is accumulated in a body region including a channel forming region, which causes a parasitic bipolar effect. Thus, a kink is generated, an operation withstand voltage is lowered, and various kinds of problems are caused by a substrate floating effect such that frequency dependency of a delay time is generated because the potential of the body region is not stable.

In order to fix the potential of the body region in the SOI device having the FTI structure, a structure called a source tie disclosed in Japanese Patent Application Laid-Open No. 2005-93875 (FIGS. 1 and 5), for example, has been proposed.

The source tie means an impurity region provided in the surface of a source layer or provided so as to be in contact with the source layer of a MOS transistor and having a conductivity type opposite to that of the source layer, and the impurity region is electrically connected to the body region under the gate electrode.

The source tie allows the carrier (hole or electron) generated by the collisional ionization phenomenon to flow from the body region to the source layer through the source tie, whereby the potential of the body region can be fixed, so that the kink can be prevented from being generated and the operation withstand voltage can be prevented from being lowered.

In addition, a partial trench isolation (PTI) structure has been proposed as a constitution other than the source tie to fix the potential of the body region in the SOI device.

The PTI structure includes the partial trench isolation insulation film formed by forming a trench in the surface of the SOI layer such that the SOI layer having a predetermined thickness is left between the bottom of the trench and the buried oxide film and burying an insulator in the trench.

According to the PTI structure, the carrier can be moved to a predetermined body contact region (impurity region having a conductivity type opposite to that of the source layer) through a well region under the partial trench isolation insulation film, so that the carrier can be prevented from being accumulated in the body region and the potential of the body region can be fixed through the well region, so that various problems caused by the substrate floating effect are not generated.

Here, although the term "MOS" stands for Metal-Oxide-Semiconductor, this is not always limited to a laminated structure of metal/oxide/semiconductor and this specification is not premised on such limitation. That is, in view of common knowledge in technique, the term "MOS" means a laminated structure of dielectric/insulator/semiconductor in a broad sense as well as an original meaning thereof.

In addition, in this specification, a field effect transistor having the MOS structure is just called "MOS transistor".

Even in the case where the potential of the body region is fixed by the source tie in the SOI device having the FTI structure, or even in the case where the potential of the body region is fixed by the body contact region in the SOI device having the FTI structure, when the gate width is longer than the gate length of the gate electrode of the MOS transistor, resistance of the body region (body resistance) becomes high and the carrier is hard to move, causing a parasitic bipolar effect.

SUMMARY OF THE INVENTION

It is an object of the present invention to provide a semiconductor device in which a kink is prevented from being generated and an operation withstand voltage is prevented from being lowered and operation characteristics does not vary.

A semiconductor device in accordance with a first aspect of the present invention includes an SOI substrate having a semiconductor substrate, a buried oxide film formed on the semiconductor substrate, and an SOI layer having a first conductivity type formed on the buried oxide film and at least one MOS transistor provided on the SOI layer. The at least one MOS transistor includes a first electrode region and a second electrode region having a second conductivity type selectively and provided in the surface of the SOI layer, a body region having a first conductivity type and corresponding to the SOI layer sandwiched between the first electrode region and the second electrode region, a gate electrode provided above the body region, a partial isolation insulation film selectively provided in the SOI layer surface corresponding to the lower part of at least one end of both ends of the gate electrode in a gate width direction, in the peripheral region of an active region including the first electrode region, the second electrode region and the body region, a semiconductor region provided in the surface of the SOI layer so as to be adjacent to the partial isolation insulation film, and at least one semiconductor region within the electrode region having a first conductivity type, selectively provided in the surface of the first electrode region in the vicinity of the gate electrode and electrically connected to the body region. The partial isolation insulation film has the SOI layer continued from the body region, in a lower part thereof, the semiconductor region is in contact with the SOI layer under the partial isolation insulation film, and a region other than the partial isolation insulation film in the peripheral region of the active region is surrounded by a full isolation insulation film penetrating the SOI layer and reaching the buried oxide film.

As described above, since the semiconductor region adjacent to the partial isolation insulation film and at least one semiconductor region within the electrode region having the first conductivity type that is electrically connected to the body region are provided, the potential of the body region can be fixed through the semiconductor region and the semiconductor region within the electrode region, so that the potential fixing effect of the body region can be enhanced as compared with the case where the potential is fixed by either one of them.

Furthermore, since the region other than the region where the partial isolation insulation film is provided in the periphery of the active region can be surrounded by the full isolation insulation film whose isolation width can be narrower than that of the partial isolation insulation film, an integration thereof can be improved as compared with the case where the whole periphery of the active region is surrounded by the partial isolation insulation film.

In addition, when the region other than the region where the partial isolation insulation film is provided is surrounded by the full isolation insulation film, the PN junction parasitic capacity can be reduced and the capacity can be lowered as compared with the case where the whole periphery of the active region is surrounded by the partial isolation insulation film.

A semiconductor device according to a second aspect of the present invention includes an SOI substrate having a semiconductor substrate, a buried oxide film formed on the semiconductor substrate, and an SOI layer having a first conductivity type and at least one MOS transistor provided on the SOI layer. The at least one MOS transistor includes a first electrode region and a second electrode region having a second conductivity type and selectively provided in the surface of the SOI layer, a body region having a first conductivity type and corresponding to the SOI layer sandwiched between the first electrode region and the second electrode region, a gate electrode provided on the body region, and a plurality of semiconductor regions within the electrode region having a first conductivity type and provided in the surface of the first electrode region in the vicinity of the gate electrode so as to be spaced and aligned along the gate electrode and electrically connected to the body region. The peripheral region of an active region including the first electrode region, the second electrode region, and the body region is surrounded by a full isolation insulation film penetrating the SOI layer and reaching the buried oxide film, and the plurality of semiconductor regions within the electrode region are arranged such that a first distance between the end of the arrangement and the nearest edge of the active region becomes the half of a second distance between the semiconductor regions within the electrode region.

As described above, according to the plurality of semiconductor regions within the electrode region, since the first distance between the end of the arrangement and the nearest edge of the active region is set to be the half of the second distance between the semiconductor regions within the electrode region, the length of the body region whose potential is to be fixed by one semiconductor region within the electrode region can be equal, the withstand voltage between the main electrodes per the gate electrode can be equal, so that the withstand voltage between the main electrodes can be prevented from varying. As a result, the MOS transistor having a small leak current can be provided and a stable circuit operation can be implemented.

Furthermore, since a semiconductor region is not provided outside the active region to fix the potential of the body region, it is not necessary to provide the partial isolation insulation film. As a result, the manufacturing steps can be simplified and the PN junction parasitic capacity can be reduced and the capacity can be lowered.

In addition, when the channel is the same, the area efficiency can be improved because the semiconductor region for fixing the potential of the body region is not provided outside the active region.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 5 are plan views showing the constitution of a MOS transistor according to a first aspect of an embodiment 1 of the present invention;

FIG. 10 is a plan view showing the constitution of a MOS transistor according to a fourth aspect of the embodiment 1 of the present invention;

FIG. 13 is a block diagram showing the constitution of a semiconductor integrated circuit to which the present invention can be applied;

FIGS. 19 to 27 are sectional views to explain a step of forming a source tie region.

DESCRIPTION OF THE PREFERRED EMBODIMENTS

A. Embodiment 1

A-1 First Aspect

Figure 6:
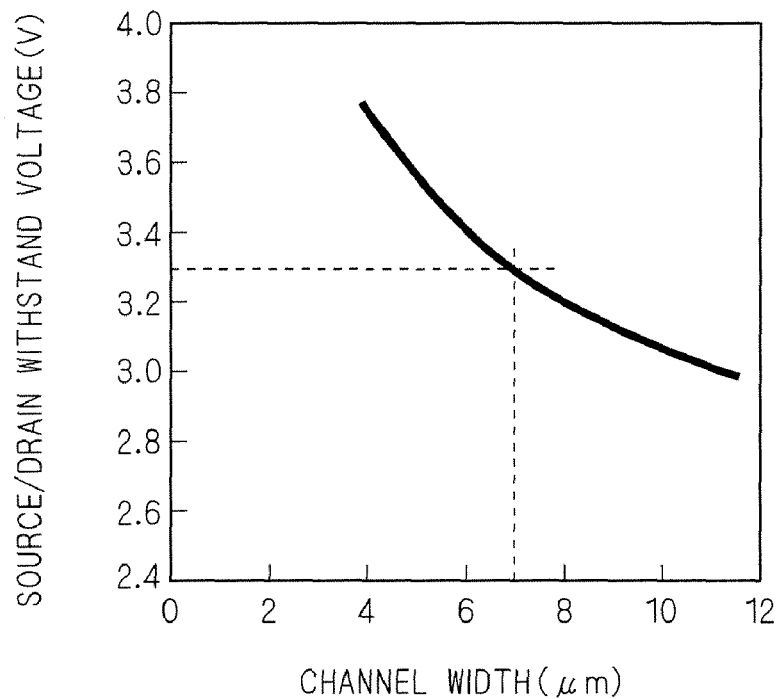
FIG. 6 is a view to explain gate width dependency of a source/drain withstand voltage.

First, a first aspect of an embodiment 1 of a semiconductor device according to the present invention will be described with reference to a MOS transistor shown in FIG. 1.

A-1-1. Device Constitution

FIG. 1 is a plan view showing the constitution of the MOS transistor 100.

As shown in FIG. 1, the MOS transistor 100 is an N-channel MOS transistor (N MOS transistor) including a source region 31 and a drain region 32 that are electrode regions in which N type impurity is doped in a relatively high concentration, in the surface of an SOI substrate SB on both sides of a gate electrode 5 in a gate length direction, and the gate electrode 5 is provided on a body region (whose surface is a channel region, however, both are not shown) between the source region 31 and the drain region 32 with a gate insulation film (not shown) interposed between them.

In addition, although a region in which the source region 31, the drain region 32 and the body region are formed is called an active region collectively, the gate electrode 5 is provided such that both ends thereof in a gate width direction are projected from the active region in a plan view. In addition, a partial trench isolation insulation films 8 (partial isolation insulation film) are provided in the SOI substrate SB corresponding to the lower parts of the above both ends.

The partial trench isolation insulation films 8 are provided at not only both ends of the gate electrode 5 but also at a peripheral part thereof.

In addition, the active region except for a region in which the partial trench isolation insulation films 8 are provided is surrounded by a full trench isolation insulation film FT (full isolation insulation film) so that it is electrically isolated from another semiconductor element.

Furthermore, body contact regions 21 are provided in the surface of the SOI substrate SB on both sides of the gate electrode 5 in the gate width direction so as to be adjacent to the partial trench isolation insulation films 8.

The body contact region 21 is an impurity region for fixing the potential of the body region at the lower part of the gate electrode 5, in which an impurity having the same conductivity type as that of the body region (P type in this case) is doped in a relatively high concentration.

Since the body contact region 21 and the body region are electrically connected through an SOI layer (well region) under the partial trench desolation insulation film 8, when the body contact region 21 is connected to the grand potential or the power supply potential, the potential of the body region can be fixed. In addition, in the case of the NMOS transistor, the body contact region is connected to the grand potential and in the case of the P channel MOS transistor (PMOS transistor), the body contact region is connected to the power supply potential.

Thus, the constitution provided with the body contact region that can fix the potential of the body region, on both sides of the body region in the gate width direction is called both-side potential fixing.

Furthermore, a source tie region 4 (a semiconductor region in the electrode region) in which an impurity having a conductivity type (P type in this case) opposite to that of the source region 31 is doped in a relatively high concentration is provided in the surface of the source region 31 in the vicinity of the center of the gate electrode 5 in the gate width direction.

The source tie region 4 is formed by ion doping after a sidewall insulation film (not shown) has been formed. Since the body region is formed so as to be in contact with the source tie region 4, the potential of the body region can be fixed through the source tie region 4. This constitution will be described more in detail below.

Figure 2:
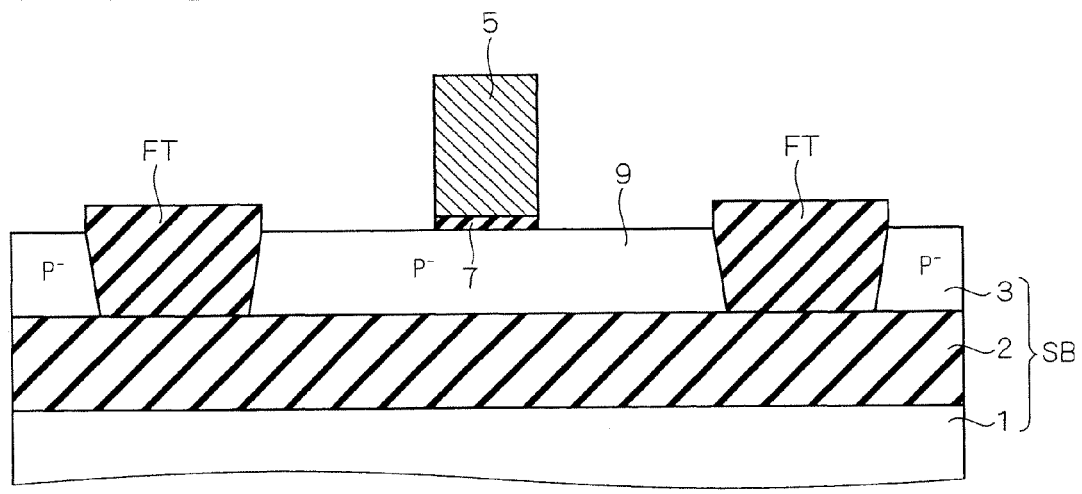
Figure 2:
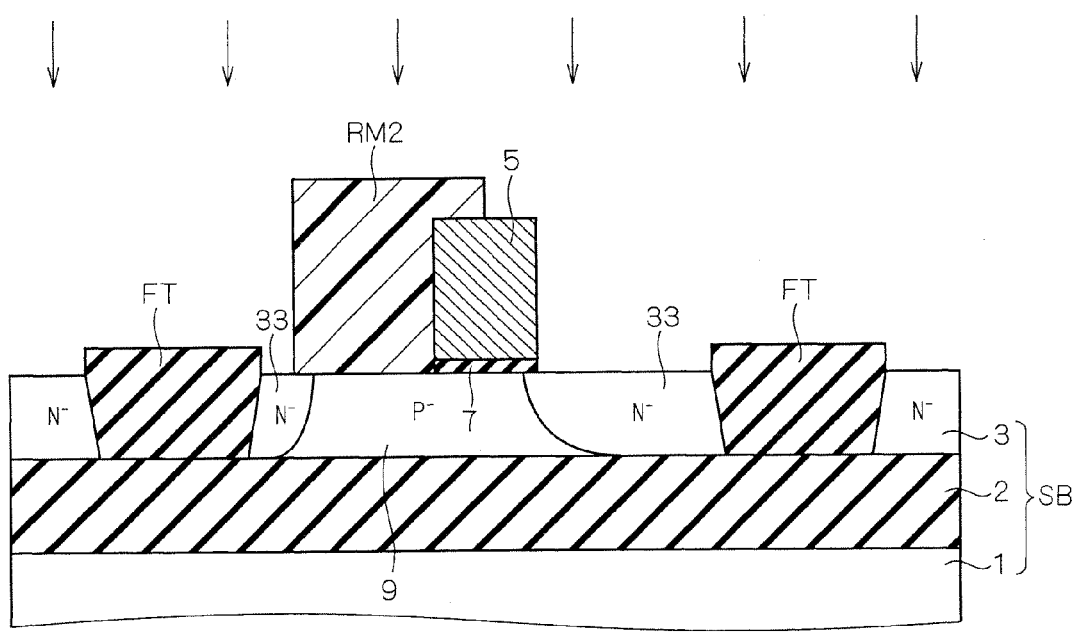

First, FIG. 2 shows a sectional view taken along an A-A line in FIG. 1. As shown in FIG. 2, in the SOI substrate SB, a buried oxide film 2 and an SOI layer 3 are laminated on a silicon substrate 1 in this order. The source region 31 and the drain region 32 are provided in the surface of the SOI layer 3, and the source tie region 4 is partially provided at the end of the source region 31 so as to be opposed to the drain 32.

FIG. 3 shows a sectional view taken along a B-B line in FIG. 1.

In the part other than the part where the source tie region 4 is provided, the body region 30 containing P type impurity in the relatively low concentration is provided so as to be sandwiched between N type LDD (lightly doped drain) regions 33 provided on the opposed side of the source region 31 and drain region 32 as shown in FIG. 3, and in the part where the source tie region 4 is provided, the body region 30 is provided so as to be in contact with the source tie region 4 as shown in FIG. 2. Therefore, the potential of the body region 30 can be fixed through the source tie region 4.

Here, as one aspect of the impurity concentration at each region, the body region 30 has a concentration about $1\times10^{17}$ to $1\times10^{18}/cm^3$, the LDD region 33 has a concentration about $1\times10^{19}/cm^3$, the source tie region 4, the source region 31 and the drain region 32 have a concentration about $1\times10^{20}/cm^3$.

In addition, as shown in FIGS. 2 and 3, the gate electrode 5 is provided on the body region 30 with a gate insulation film 7 between them, and a sidewall insulation film 6 is provided on the sides of the gate electrode 5.

In addition, since a silicide layers SS are provided on the source region 31, the drain region 32 and the gate electrode 5, and the silicide layer SS is also provided on the source tie region 4, the potential of the source tie region 4 is equal to the potential of the source region 31.

FIG. 4 shows a sectional view taken along a C-C line in FIG. 1, and FIG. 5 shows a sectional view taken along a D-D line in FIG. 1.

As shown in FIG. 4, a well region 9 is provided between the bottom of the partial trench isolation insulation film 8 and the buried oxide film 2 and electrically connects the body contact region 21 to the body region 30. In addition, since the well region 9 and the body region 30 contains the same conductivity type of impurity basically, they can be regarded as the same impurity region. However, since they have different roles, they are distinguished. In addition, since the impurity concentration of the well region 9 under the partial trench isolation insulation film 8 is higher than that of the body region 30 in some cases, they are the different impurity regions in this case, so that they are distinguished.

In addition, as shown in FIGS. 4 and 5, the silicide layer SS is also provided on the body contact region 21.

A-1-2. Effect

According to the MOS transistor 100 described above, since the potential of the body region 30 is fixed through the two body contact regions 21 provided on both sides of the gate electrode 5 in the gate width direction, and the potential of the body region 30 is fixed through the source tie region 4, the fixing effect of the potential of the body region 30 can be enhanced as compared with the case where the potential is fixed by either one of those.

That is, in a case where the gate width is longer than the gate length of the gate electrode 5, the body resistance is high, so that the potential fixing of the body region 30 in the vicinity of the gate center could be unstable when the potential is fixed only through the two body contact regions 21. Thus, when the source tie region 4 is provided in the vicinity of the center of the gate electrode 5, the above concern can be surely solved.

Next, the dependency of source/drain withstand voltage on the gate width in the MOS transistor 100 will be described with reference to FIG. 6.

In FIG. 6 the horizontal axis indicates a channel width (μm) and the vertical axis indicates a source/drain withstand voltage (V) and it has been found that the channel width is to be set about 7 μm to provide the withstand voltage of 3.3V. Therefore, in the MOS transistor used in the circuit having the operation voltage of 3.3V, when the channel width is set to 7 μm at a maximum, the MOS transistor can prevent a leak current and a stable circuit operation can be implemented.

Here, since the channel width corresponds to the length (that is called a finger length in some cases) of the gate electrode in the gate width direction on the active region, the characteristics shown in FIG. 6 are the characteristics when the gate length is about 0.4 μm.

In addition, when the potential of the body region 30 is fixed by the two body contact regions 21 or by the source tie region 4, the characteristics become different from the characteristics shown in FIG. 6 because the channel width has to be further reduced to provide the withstand voltage of 3.3V.

When the channel width cannot be set long, the number of the MOS transistors has to be increased to provide the same current driving force as that in the case where the channel width is long, which means the area efficiency of a semiconductor integrated circuit is lowered and an integration thereof cannot be improved. However, according to the MOS transistor 100 shown in FIG. 1, that above concern can be solved.

Furthermore, according to the MOS transistor 100, since the element is isolated because the full trench isolation insulation film FT surrounds the active region other than both ends of the gate, the integration can be improved.

That is, since the isolation width required in the full isolation region can be narrower than the isolation width required in the partial isolation region in general, the integration can be improved as compared with the case where the whole peripheral region of the active region is surrounded by the partial trench isolation insulation film.

In addition, since the periphery of the active region other than the regions of the gate ends is surrounded by the full trench isolation insulation film FT, the PN junction parasitic capacity can be reduced as compared with the case where the whole periphery of the active region is surrounded by the partial trench isolation insulation film.

That is, since the well region (corresponding to the well region 9 in FIG. 4) exists under the partial trench isolation insulation film, the PN junction parasitic capacity is formed between the well region and the active region. Therefore, when the whole periphery of the active region is surrounded by the partial trench isolation insulation film, the PN junction parasitic capacity is increased. However, according to the MOS transistor 100, the PN junction parasitic capacity can be reduced and the capacity can be lowered.

A-1-3. Variation

Figure 7:
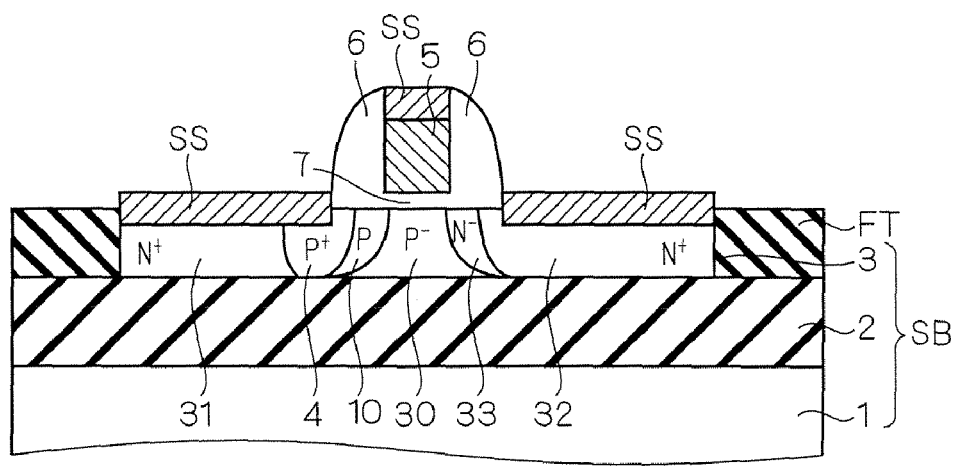
FIG. 7 is a sectional view showing a variation of the constitution of the MOS transistor according to the first aspect of the embodiment 1 of the present invention.

According to the MOS transistor 100 regarding the first aspect, as described with reference to FIGS. 2 and 3, the source tie region 4 is provided at a part of the source region 31 on the side opposed to the drain region 32 and the source tie region 4 is opposed to the LDD region 33 on the side of the drain region 32. Meanwhile, according to a variation, as shown in FIG. 7, a front semiconductor region 10 having the same conductivity type (P type here) as that of the source tie region 4 may be provided at the front part of the source tie region 4, that is, on the opposite side of the source region 31 across the source tie region 4 so as to be in contact with the source tie region 4.

In addition, the front semiconductor region 10 is formed at a step for forming the LDD region of the PMOS transistor and having the same depth as that of the LDD region 33 and spreads in the gate length direction and an impurity concentration thereof is about $1 \times 10^{19}/cm^3$.

Since the impurity concentration of the front semiconductor region 10 is higher than that of the body region 30, the resistance value of the body region 30 at the part being in contact with the source tie region 4 can be partially lowered, so that the potential fixing effect can be enhanced.

A-2. Second Aspect

Next, a second aspect of the semiconductor device according to the embodiment 1 of the present invention will be described with reference to a MOS transistor 100A shown in FIG. 8.

Figure 8:
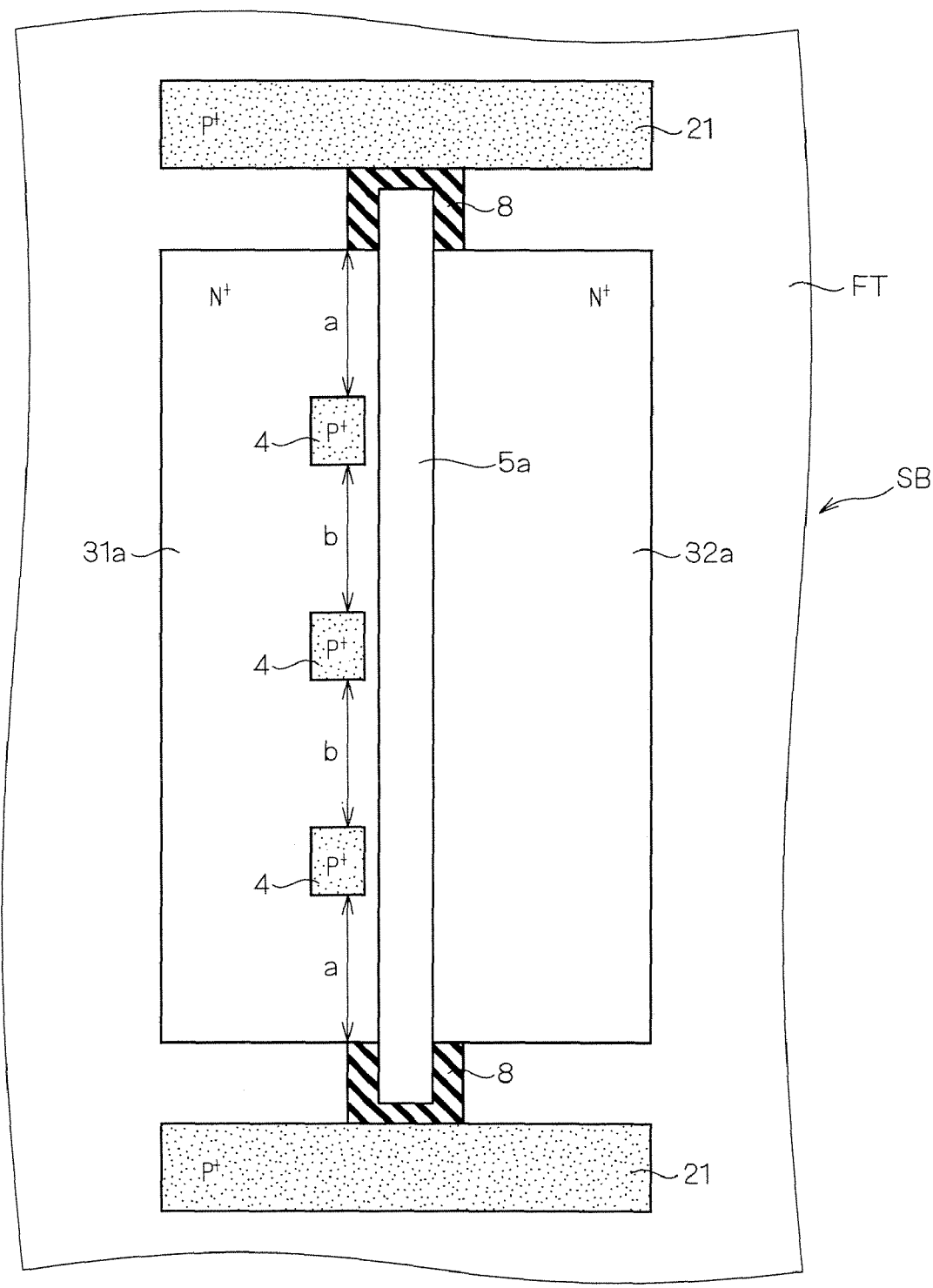
FIG. 8 is a plan view showing the constitution of a MOS transistor according to a second aspect of the embodiment 1 of the present invention.

FIG. 8 is a plan view showing the constitution of the MOS transistor 100A.

As shown in FIG. 8, the MOS transistor 100A is basically the same as the MOS transistor 100 shown in FIG. 1 except that a gate electrode 5a of the MOS transistor 100A is longer than the gate electrode 5 and accordingly a source region 31a and a drain region 32a are longer than the source region 31 and the drain region 32. In addition, three source tie regions 4 are spaced and aligned along the gate electrode 5a.

The three source tie region 4 are provided such that the distance "a" between the adjacent source tie regions 4 is equal and the distance "b" between the source tie region 4 at the end of the source tie arrangement and the nearest edge of the active region on the side of a partial trench isolation insulation film 8 is equal.

Thus, by setting the distances such that a=b, the gate electrode is divided in the gate width direction at the same intervals in fixing the potential, so that the same effect provided when a plurality of gate electrodes having a short channel width are provided can be substantially provided. Therefore, since the source/drain withstand voltage per gate electrode can be enhanced, even when the gate width is considerably longer than the gate length like the gate electrode 5a, the leak current can be prevented in the MOS transistor.

In addition, by setting the number of the source tie regions 4 so as to make allowance for the source/drain withstand voltage, even when the power supply voltage varies to some extent, the leak current can be prevented from being increased, so that the MOS transistor can have an operation margin.

When the number of source tie regions 4 is increased, although the source/drain withstand voltage per gate electrode can be further enhanced, since the part where the source tie region 4 is formed does not function as the MOS transistor, the length of the gate electrode, that is, the finger length has to be increased for the increased number of the source tie regions 4 in order to provide the same current driving force as that provided when the number of the source tie region 4s is small, which lowers the area efficiency of the MOS transistor. Therefore, in view of the trade-off relation between the improvement of the source/drain withstand voltage and the area efficiency, the number of the source tie regions 4 is to be set.

According to a simple aspect based on the characteristics shown in FIG. 6, in a case of a MOS transistor having a channel width of about 20 μm, when two source tie regions 4 are provided at the equal interval, the gate electrode is divided into three substantially and the channel width of each gate electrode is 7 μm or less, so that it has a withstand voltage of 3.3V. Thus, when it is used in the circuit having the operation voltage of 3.3V, a leak current is small in the MOS transistor, so that a stable circuit operation can be implemented.

In addition, even when the gate width is considerably longer than the gate length like the gate electrode 5a, since the plurality of source tie regions 4 are provided, the potential at each part of the body region 30 can be surely fixed, so that potential fixing effect of the body region 30 can be surely provided.

Furthermore, like the MOS transistor 100, since the active region other than the region of the gate both ends is entirely surrounded by a full trench isolation insulation film FT to isolate the element, the integration can be improved and the PN junction parasitic capacity is reduced and the capacity can be lowered as compared with the case where the whole periphery of the active region is surrounded by the partial trench isolation insulation film.

A-3. Third Aspect

Next, a third aspect according to the embodiment 1 of the present invention will be described with reference to a MOS transistor 100B shown in FIG. 9.

Figure 9:
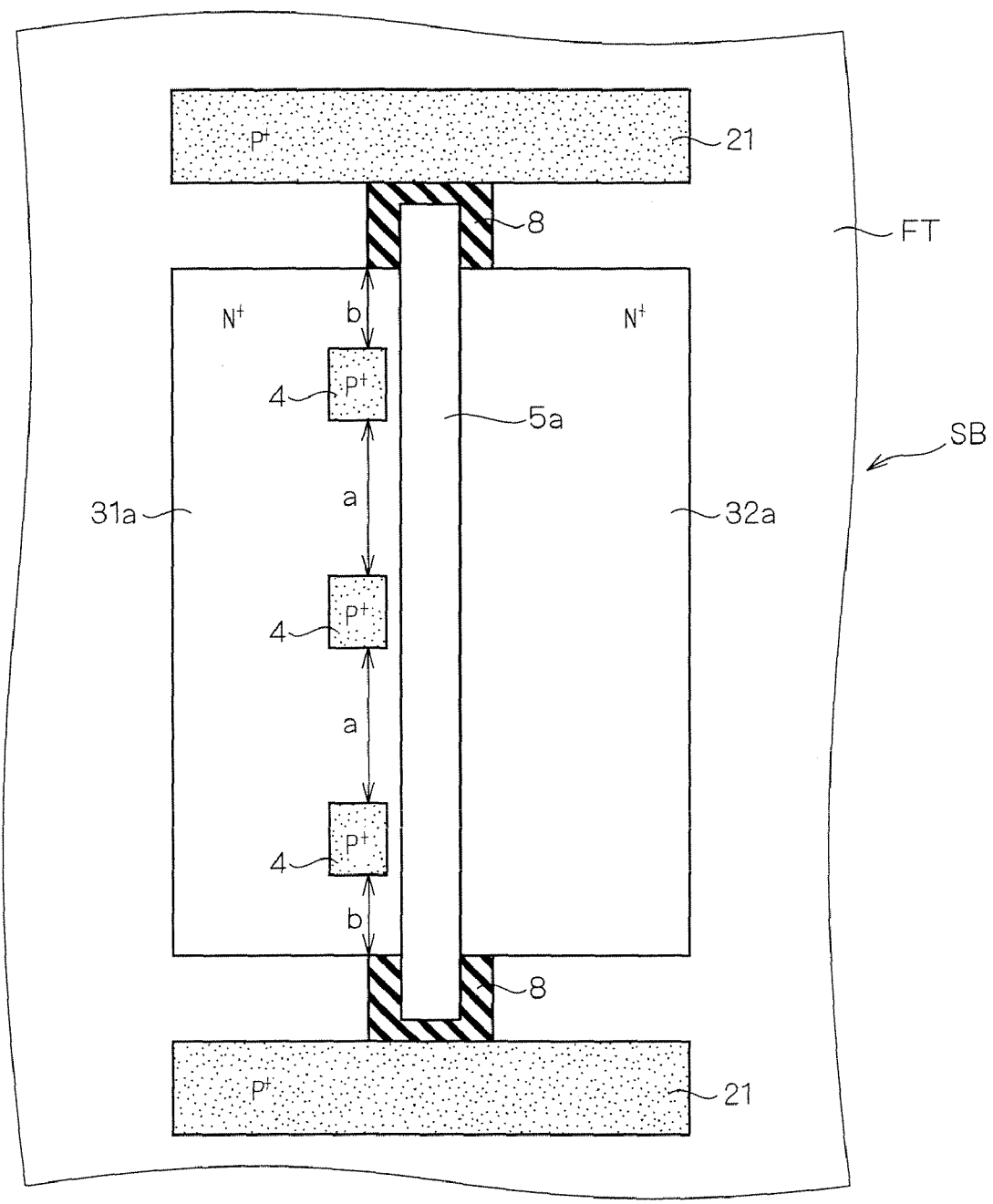
FIG. 9 is a plan view showing the constitution of a MOS transistor according to a third aspect of the embodiment 1 of the present invention.

FIG. 9 is a plan view showing the constitution of the MOS transistor 100B.

As shown in FIG. 9, the MOS transistor 100B is basically the same as the MOS transistor 100 shown in FIG. 1 except that a gate electrode 5a of the MOS transistor 100B is longer than the gate electrode 5 and accordingly a source region 31a and a drain region 32a are longer than the source region 31 and the drain region 32. In addition, three source tie regions 4 are spaced and aligned along the gate electrode 5a.

The three source tie regions 4 are arranged such that the distance "a" between the adjacent source tie regions 4 is equal and the distance "b" between the source tie region 4 at the end of the source tie arrangement and the nearest edge of the active region on the side where the partial trench isolation insulation film 8 is provided is equal.

Thus, when the distance "b" is set so as to be smaller than the distance "a", the gate electrode 5a can be divided so that the body resistance becomes almost equal.

That is, among body resistances of the body regions under the substantially divided gate electrodes 5a, in the resistance of the body region between the source tie region 4 at the end of the source tie arrangement and the partial trench isolation insulation film 8, that is, the body region at the part of the distance "b", the resistance of the well region under the partial trench isolation insulation film 8 is added in series.

Therefore, when the resistance of the well region under the partial trench isolation insulation film 8 is considerably small, since only the body resistance of the part of the distance "b" is to be considered, the gate electrode 5a may be divided so that the distances "a" and "b" become equal and the body resistance of the gate electrode 5a can be almost uniformly divided. However, when the resistance of the well region under the partial trench isolation insulation film 8 cannot be ignored, the length "b" is set to be shorter than the distance "a" in view of that resistance of the well region.

For example, in the case where the resistance of the well region under the partial trench isolation insulation film 8 is about the same as that of the body resistance at the part of the distance "b", when the distance "b" is set to the half of the distance "a", the body resistance between the source tie regions 4 and the resistance between the source tie region 4 at the end of the source tie arrangement and the body contact region 21 become almost the same, which means that the gate electrode 5a are divided into four so that the body resistance becomes almost equal.

Thus, when the gate electrode 5a is divided so that the body resistance becomes equal, the length of the body region whose potential is to be fixed by the source tie region 4 becomes equal and the source/drain withstand voltage per gate electrode can be equal and the source/drain withstand voltage is prevented from varying. As a result, a leak current is small in the MOS transistor and further stable circuit operation can be implemented.

A-4, Fourth Aspect

Next, a fourth aspect according to the embodiment 1 of the present invention will be described with reference to a MOS transistor 100C shown in FIG. 10.

FIG. 10 is a plan view showing the constitution of the MOS transistor 100C.

As shown in FIG. 10, the MOS transistor 100C is different from the MOS transistor 100 shown in FIG. 1. According to the MOS transistor 100C, a partial trench isolation insulation film 8 is provided in the surface of an SOI substrate SB corresponding to the lower part of one end of both ends of the gate electrode 5a in the gate width direction that are projected from an active region in a plan view, and a full trench isolation insulation film FT is provided in the peripheral part of the active region other than the above part including the lower part of the other end of the gate electrode 5a.

Thus, the constitution including a body contact region that can fix the potential of a body region only on one end of the gate electrode in the gate width direction is referred to as one-side potential fixing.

Although the constitution other than the above is basically the same as the MOS transistor, the gate electrode 5a of the MOS transistor 100C is longer than the gate electrode 5 and accordingly a source region 31a and a drain region 32a are longer than the source region 31 and the drain region 32, respectively. In addition, three source tie regions 4 are spaced and aligned along the gate electrode 5a.

The three source tie regions 4 are arranged such that there are provided the equal distance "b" between the source tie regions 4, the distance "a" between the source tie region 4 at one end of the source tie arrangement on the side of the partial trench isolation insulation film 8 and the partial trench isolation insulation film 8, and the distance "c" between the source tie region 4 at the other end of the source tie arrangement and the nearest edge of the active region.

Thus, when the distance "c" is set to be smaller than the distance "a", and the distance "c" is set to be the half of the distance "b", the gate electrode 5a can be divided such that the body resistance becomes almost equal.

That is, among body resistances of the body regions under the substantially divided gate electrodes 5a, in the resistance of the body region between the source tie region 4 at one end of the source tie arrangement and the body contact region 21, that is, the body region at the part of the distance "a", the resistance of the well region under the partial trench isolation insulation film 8 is added in series.

Therefore, when the resistance of the well region under the partial trench isolation insulation film 8 cannot be ignored, the distance "a" is set to be shorter than the distance "b" by the amount corresponding to that resistance, so that the body resistance between the source tie regions 4 and the resistance between the source tie region 4 at the one end of the source tie arrangement and the body contact region 21 become almost equal.

In addition, when the resistance of the well region under the partial trench isolation insulation film 8 is considerably small, since only the body resistance of the distance "a" has to be considered, in this case, the distances may be set such that a=b.

In addition, in the body region between the source tie region 4 at the other end of the source tie arrangement and the nearest edge of the active region, that is, the body region at the distance "c", since the potential is fixed only by the source tie region 4 at the other end of the source tie arrangement, when the distance "c" is set to the half of the distance at the body region between the source tie regions 4, that is, the body region at the distance "b", a body resistance thereof becomes substantially the same as the resistance between the source tie regions 4, so that the gate electrode 5a is divided into four so that the body resistance becomes almost equal.

Thus, by dividing the gate electrode 5a, even in the case of the constitution of the one-side potential fixing, the length of the body region whose potential is to be fixed by one source tie region 4 can be equal, and the source/drain withstand voltage per gate electrode can be equal, so that the source/drain withstand voltage is prevented from varying. As a result, a leak current is small in the MOS transistor and a more stable circuit operation can be implemented.

In addition, even in the case of constitution of the one-side potential fixing, the distances can be such that a=b=c by increasing the number of source tie regions 4. In this case, it is desirable that the number of the source tie regions 4 is set so that these distances "a" and "b" are to be conformed to the distance "c".

A-5. Fifth Aspect

A-5-1. Device Constitution

Next, a fifth aspect according to the embodiment 1 of the present invention will be described with reference to a MOS transistor 100D shown in FIG. 11.

Figure 11:
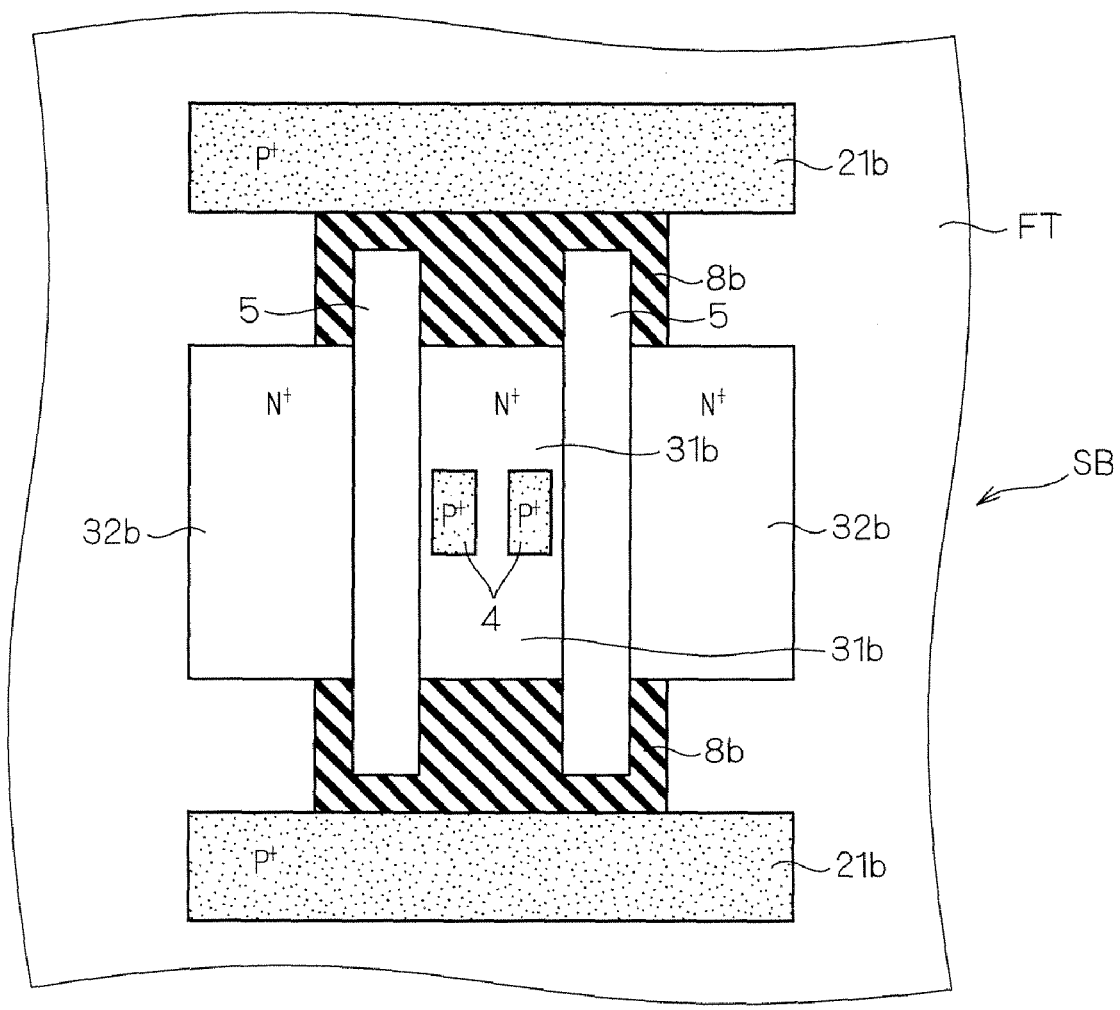
FIG. 11 is a plan view showing the constitution of a MOS transistor according to a fifth aspect of the embodiment 1 of the present invention.

FIG. 11 is a plan view showing the constitution of the MOS transistor 100D.

As shown in FIG. 11, the MOS transistor 100D has a constitution in which the two MOS transistors shown in FIG. 1 are arranged in parallel in the gate length direction so that two gate electrodes 5 are arranged in parallel in the gate length direction, a source region 31b doped with an N type impurity in a relatively high concentration is provided in the surface of an SOI substrate SB between the gate electrodes 5, and a drain region 32b doped with an N type impurity in a relatively high concentration is provided in the surface of the SOI substrate SB outside the gate electrodes 5 so as to be opposed to the source region 31b. Therefore, according to the MOS transistor 100D, although there are two MOS transistors arranged in parallel, they are regarded as one transistor for convenience.

Thus, partial trench isolation insulation films 8b are provided in the surface of the SOI substrate SB corresponding to the lower parts at both ends of the two gate electrodes 5.

The partial trench isolation insulation film 8b is continuously provided so as to cross the lower parts of one ends of the two gate electrodes 5.

Therefore, the length of the partial trench isolation insulation film 8b in the gate length direction is determined by adding a superposition margin at the step of manufacturing the gate electrode 5 to the lengths of the provided regions of the two gate electrodes 5 in the gate length direction.

In addition, the active region other than the region in which the partial trench isolation insulation film 8b is provided is surrounded by a full trench isolation insulation film FT so as to be isolated from another semiconductor element.

In addition, body contact regions 21b are provided in the surface of the SOI substrate SB outside both ends of the gate electrodes 5 in the gate width direction so as to be adjacent to the partial trench isolation insulation films 8.

In addition, although the body contact region 21b seems to have the same length as that of the side of the active region in the gate length direction in the drawing, this is only an aspect and it only has to have the same length as that of the partial trench isolation insulation film 8b in the gate length direction.

Furthermore, source tie regions 4 doped with an impurity having a conductivity type (P type in this case) opposite to that of the source region 31b in a relatively high concentration are separately provided in the surface of the source region 31b in the vicinity of the center of the two gate electrodes 5 in the gate width direction.

Thus, by employing the structure in which the source region 31b is shared by the two MOS transistors, the area efficiency of a transistor layout can be improved.

Figure 12:
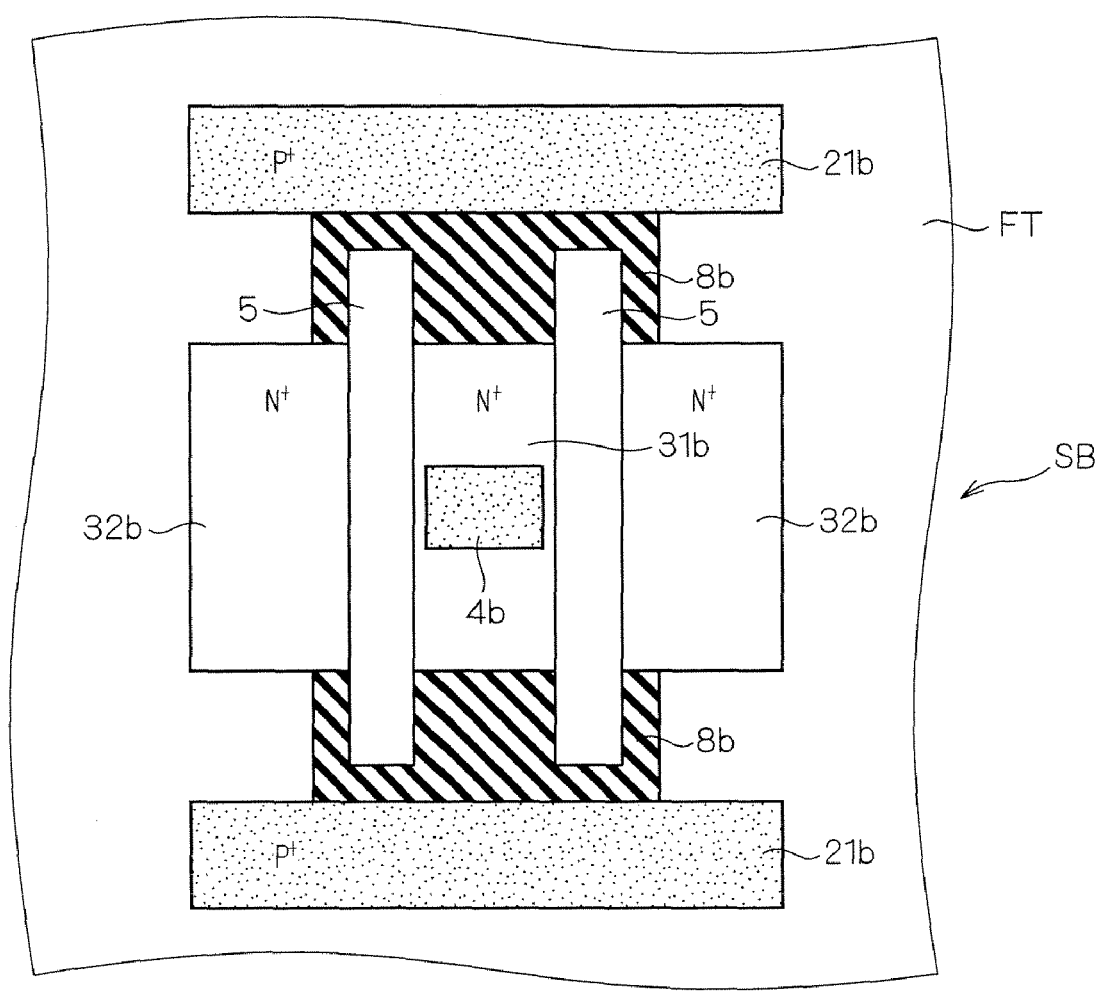
FIG. 12 is a plan view showing the constitution of a variation of the MOS transistor according to the fifth aspect of the embodiment 1 of the present invention.

Although the two source tie regions 4 are separately provided in the MOS transistor 100D shown in FIG. 11, a source tie region 4b may extend between the gate electrodes 5 in a common source region 31b in a MOS transistor 100E shown in FIG. 12.

According to the above constitution, the structure can be simplified and the manufacturing steps can be simplified.

A-5-2. Applied Aspect

Next, a description will be made of an aspect of a plane layout when the MOS transistor 100D in the fifth aspect described above is applied to a semiconductor integrated circuit.

First, one example of the whole constitution of a semiconductor integrated circuit to which the present invention can be applied will be described with reference to a block diagram shown in FIG. 13.

The semiconductor integrated circuit shown in FIG. 13 includes an input/output circuit (I/O) part 101, a logic circuit part 102, a memory part 103, an analog circuit part 104, and a calculation part 105. The input/output circuit parts 101 are provided along the four sides of the semiconductor integrated circuit 100. In addition, in the input/output circuit part 101 and the analog circuit part 104, power supplies of 1.8V, 2.5V and 3.3V are used and in other circuit parts, a power supply of 1.2V or less is used.

It is effective to use the MOS transistor according to the present invention in which the potential of the body region is fixed through the body contact region provided at both ends or one end of the gate electrode in the gate width direction and the potential of the body region is fixed through the source tie region, in the circuit part operating at the power supply voltage higher than other circuit parts like the input/output circuit part 101 and the analog circuit part 104 in the semiconductor integrated circuit having the above constitution.

Thus, an output buffer having a great current driving force is required in the input/output circuit part 101 in some cases and in this case, the required current is provided by connecting the plurality of MOS transistors in parallel in many cases.

Figure 14:
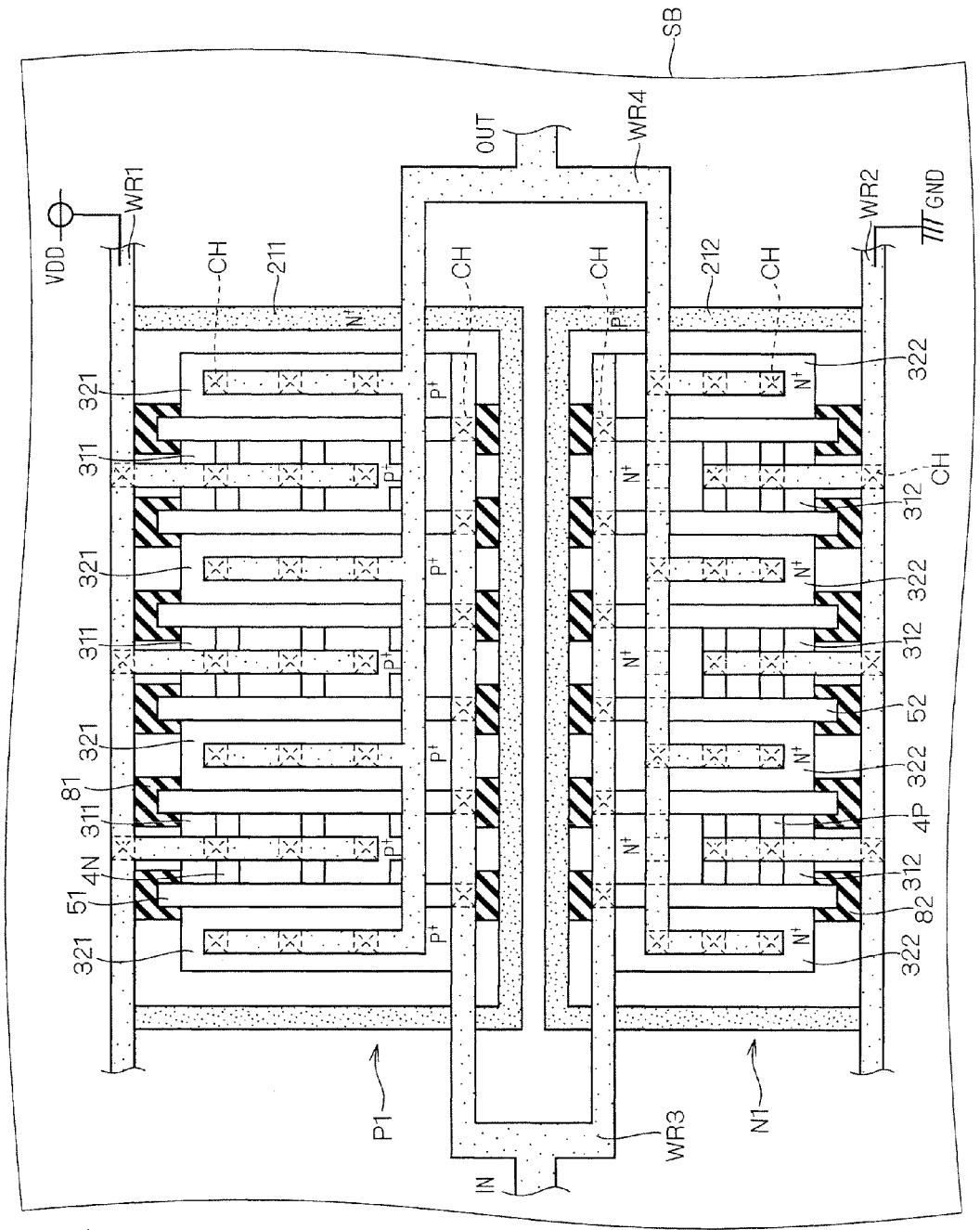
FIG. 14 is a view to explain a plane layout when the present invention is applied to an input/output circuit part.

In such case, a plane layout as shown in FIG. 14 may be employed.

That is, a plane layout of a CMOS inverter is shown in FIG. 14 in which arrangement of six PMOS transistors P1 arranged in parallel in the gate length direction and arrangement of six NMOS transistors N1 arranged in parallel in the gate length direction are provided in parallel in the gate width direction.

Thus, according to the arrangement of the PMOS transistors P1, the two adjacent PMOS transistors P1 share a source region 311 and three source tie regions 4N doped with N type impurity in a relatively high concentration are separately provided in the surface of the source region 311 along two gate electrodes 51 in the gate width direction.

In addition, partial trench isolation insulation films 81 are separately arranged in the surface of the SOI substrate SB corresponding to the lower parts of both ends of the gate electrode 51 in the gate width direction and they are aligned. In addition, a body contact region 211 doped with an N type impurity in a high concentration is continuously provided so as to be adjacent to the arrangement of the partial trench isolation insulation films 81 and this body contact region 211 extends along the arrangement direction of the gate electrodes 51 over the whole active region and also extends in the gate width direction of the gate electrodes 51 at both ends of the active region, so that it continuously surrounds the periphery of the active region.

In addition, according to the arrangement of the NMOS transistors N1, two adjacent NMOS transistors N1 share a source region 312 and three source tie regions 4P doped with P type impurity in a relatively high concentration are separately provided in the surface of the source region 312 along two gate electrodes 52 in the gate width direction.

In addition, partial trench isolation insulation films 82 are separately arranged in the surface of the SOI substrate SB corresponding to the lower parts of both ends of the gate electrode 52 in the gate width direction and they are aligned. In addition, a body contact region 212 doped with an P type impurity in a high concentration is continuously provided so as to be adjacent to the arrangement of the partial trench isolation insulation films 82 and this body contact region 212 extends along the arrangement direction of the gate electrodes 52 over the whole active region and also extends in the gate width direction of the gate electrodes 52 at both ends of the active region, so that it continuously surrounds the periphery of the active region.

Thus, the gate electrode 51, the source region 311, the drain region 321 and the body contact region 211 of the PMOS transistor P1, and the gate electrode 52, the source region 312, the drain region 322 and the body contact region 212 of the NMOS transistor N1 are electrically connected to an upper layer wiring through a contact portion CH provided so as to penetrate an interlayer insulation film (not shown).

That is, the source region 311 and the body contact region 211 of the PMOS transistor P1 are connected to a wiring WR1 through the contact portion CH and a power supply potential VDD is applied to the wiring WR1.

In addition, the source region 312 and the body contact region 212 of the NMOS transistor P2 are connected to a wiring WR2 through the contact portion CH and the ground potential GND is applied to the wiring WR2.

The gate electrode 51 of the PMOS transistor P1 and the gate electrode 82 of the NMOS transistor N1 are connected to a wiring WR3 through the contact portion CH, and an input signal of a CMOS inverter is applied to the wiring WR3.

The drain region 321 of the PMOS transistor P1 and the drain region 322 of the NMOS transistor N1 are connected to a wiring WR4 through the contact portion CH, and an output signal of the CMOS inverter is applied to the wiring WR4.

When such plane layout is employed, the area efficiency of the transistor layout can be improved.

In addition, according to the plane layout shown in FIG. 14, the body contact region 211 surrounds the arrangement of the PMOS transistors P1 and the body contact region 212 surrounds the arrangement of the NMOS transistors N1, so that this constitution effectively prevents latchup and noise.

In addition, the body contact region does not necessarily surround the MOS transistors and it may only have to be provided along the arrangement of the transistors.

Furthermore, as shown in FIG. 14, since the partial trench isolation insulation films 81 and 82 are separately provided for each of the gate electrodes 51 and 52, respectively, when the area of the partial trench isolation insulation film is limited, the PN junction parasitic capacity can be reduced.

When the manufacturing steps are to be simplified or the alignment margin at the step of manufacturing the gate electrode is to be largely provided in priority to the reduction in the PN junction parasitic capacity, the partial trench isolation insulation film is constituted such that it continuously extends along the gate electrode arrangement. However, when this constitution is employed, it is desirable that the extension length of the partial trench isolation insulation film does not exceed the entire length of the active region.

A-6, Sixth Aspect

Next, a sixth aspect according to the embodiment 1 of the present invention will be described with reference to a PMOS transistor P10 and an NMOS transistor N10 shown in FIG. 15.

Figure 15:
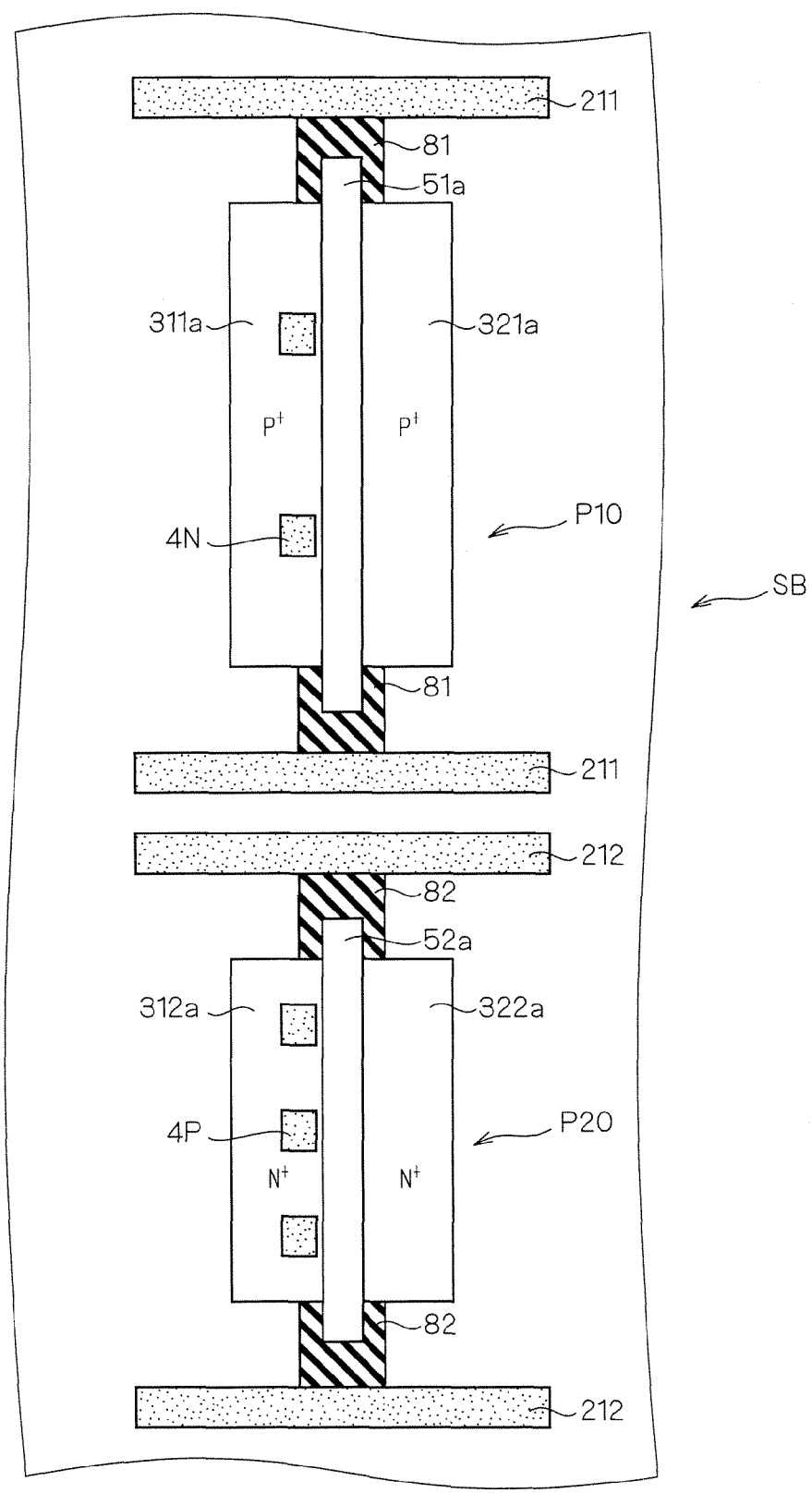
FIG. 15 is a plan view showing the constitution of the MOS transistor according to the fifth aspect of the embodiment 1 of the present invention.

FIG. 15 is a plan view showing the constitution of the PMOS transistor P10 and NMOS transistor N10, in which the PMOS transistor P10 and the NMOS transistor N10 are arranged in parallel in the gate width direction.

The PMOS transistor P10 shown in FIG. 15 includes a source region 311a and a drain region 321a provided in the surface of an SOI substrate SB on both sides of a gate electrode 51a in the gate length direction.

Partial trench isolation insulation films 81 are provided in the surface of the SOI substrate SB corresponding to the lower parts of both ends of the gate electrode 51a.

Furthermore, body contact regions 211 are provided in the surface of the SOI substrate SB outside both ends of the gate electrode 51a in the gate width direction so as to be adjacent to the partial trench isolation insulation films 81.

In addition, two source tie regions 4N are provided in the surface of the source region 311a so as to be spaced and aligned along the gate electrode 51a.

The NMOS transistor N10 includes a source region 312a and a drain region 322a provided in the surface of the SOI substrate SB on both sides of a gate electrode 52a in the gate length direction.

Partial trench isolation insulation films 82 are provided in the surface of the SOI substrate SB corresponding to the lower parts of both ends of the gate electrode 52a.

Furthermore, body contact regions 212 are provided in the surface of the SOI substrate SB outside both ends of the gate electrode 52a in the gate width direction so as to be adjacent to the partial trench isolation insulation films 82.

In addition, three source tie regions 4P are provided in the surface of the source region 312a so as to be spaced and aligned along the gate electrode 52a.

Here, although the gate width of the gate electrode 51a of the PMOS transistor P10 is set to be longer than the gate width of the gate electrode 52a of the NMOS transistor N10, the two source tie regions 4N are provided in the source region 311a and the number of the source tie regions is smaller than that in the NMOS transistor N10 in which the three source tie regions 4P are provided in the source region 312a.

This is because since carrier mobility is small in the PMOS transistor as compared with that of the NMOS transistor, the number of carriers generated by a collisional ionization phenomenon is small and parasitic bipolar effect is not likely to be generated and kink is not likely generated and the operation withstand voltage is not likely to be lowered in the PMOS transistor, so that the interval of the source tie regions 4N can be larger than that of the source tie regions 4P.

In general, since the current driving ability of the PMOS transistor is lower than that of the NMOS transistor, when the same current is to be provided, although the length of the active region of the PMOS transistor in the gate width direction is set to be longer than that of the NMOS transistor, in this case also, the area efficiency of the PMOS transistor can be improved by setting the number of the source tie regions in the PMOS transistor to be smaller than that of the NMOS transistor.

B. Embodiment 2

Although the potential of the body region is fixed through the source tie region and the potential of the body region is fixed through the body contact region provided on both ends or one end of the gate electrode in the gate width direction in the embodiment 1 of the present invention described above, the potential of the body region can be fixed by only through the source tie region.

According to an embodiment 2 of the present invention, a description will be made of a constitution in which the potential of a body region is fixed only through a source tie region.

B-1 First Aspect

First, a first aspect according to the embodiment 2 of the present invention will be described with reference to a MOS transistor 200 shown in FIG. 16.

Figure 16:
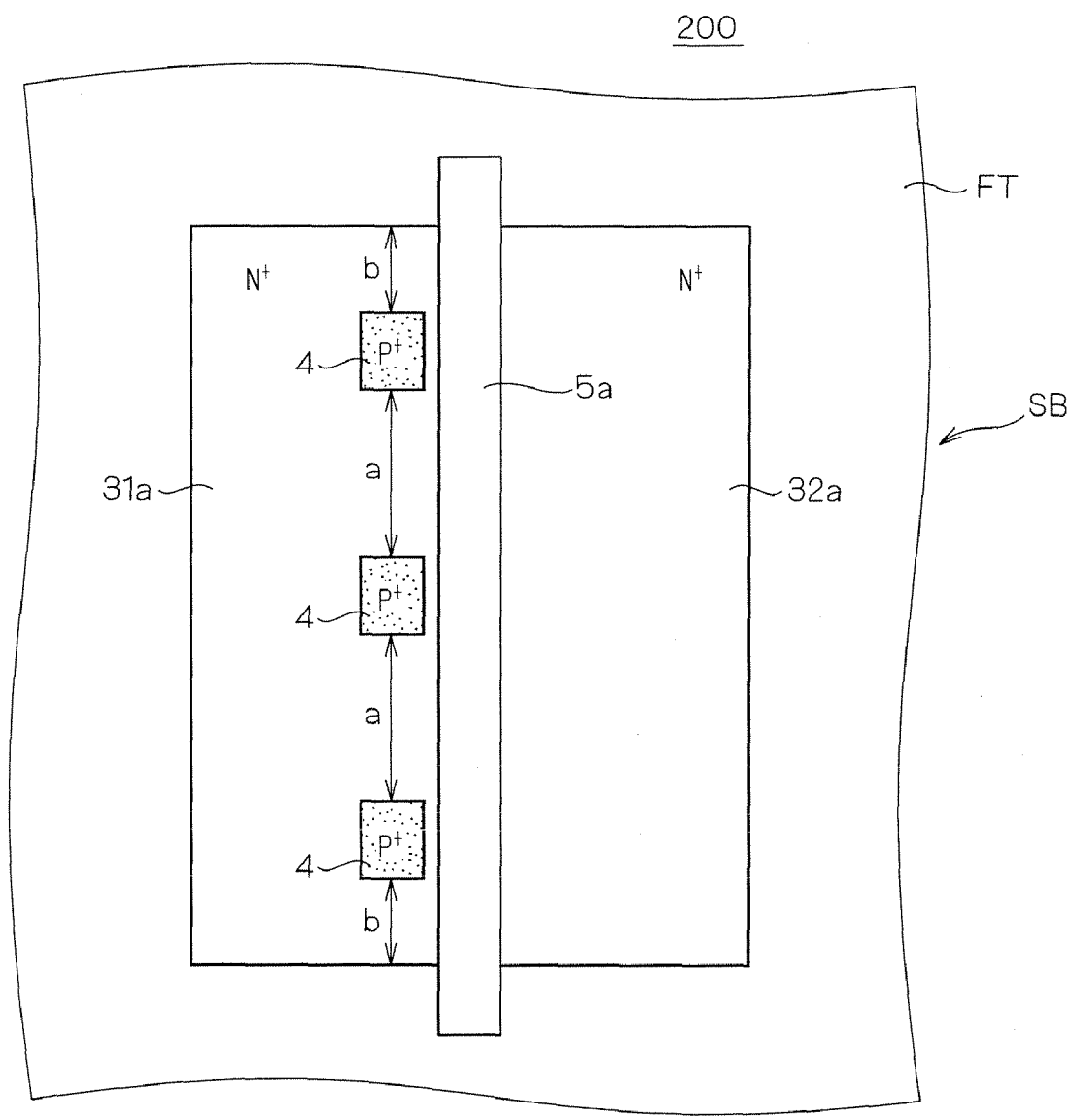
FIG. 16 is a plan view showing the constitution of a MOS transistor according to a first aspect of an embodiment 2 of the present invention.

FIG. 16 is a plan view showing the constitution of the MOS transistor 200.

As shown in FIG. 16, the MOS transistor 200 is an NMOS transistor including a source region 31a and a drain region 32a in which a N type impurity is doped in a relatively high concentration, in the surface of an SOI substrate SB on both sides of a gate electrode 6a in the gate length direction, and the gate electrode 6a is provided on a body region (not shown) between the source region 31a and the drain region 32a with a gate insulation film (not shown) interposed between them.

In addition, although a region in which the source region 31a, the drain region 32a and the body region are formed is called an active region collectively, the gate electrode 5a is provided such that both ends thereof in the gate width direction are projected from the active region in a plan view.

In addition, the periphery of the active region is surrounded by a full trench isolation insulation film FT and electrically isolated from another semiconductor element.

Three source tie regions 4 are provided so as to be spaced and aligned in the surface of the source region 31a.

The three source tie regions 4 are arranged such that the distance "a" between the source tie regions 4 is equal and the distance "b" between the source tie region 4 at the end of the source tie arrangement and the nearest edge of the active region is equal.

Thus, when the distance "b" is set to be the half of the distance "a", the length of the body region whose potential is to be fixed by the one source tie region 4 becomes equal and the source/drain withstand voltage per gate electrode can be equal and the source/drain withstand voltage is prevented from varying. As a result, the MOS transistor has a small leak current and a stable circuit operation can be implemented.

Furthermore, since the body contact region for fixing the potential of the body region is not provided, a partial trench isolation insulation film is not needed, so that the manufacturing steps can be simplified and the PN junction parasitic capacity can be reduced and the capacity can be lowered.

Furthermore, when the channel width is the same, the area efficiency can be improved because the body contact region is not provided.

B-2. Second Aspect

Next, a second aspect according to the embodiment 2 of the present invention will be described with reference to a MOS transistor 200A shown in FIG. 17.

Figure 17:
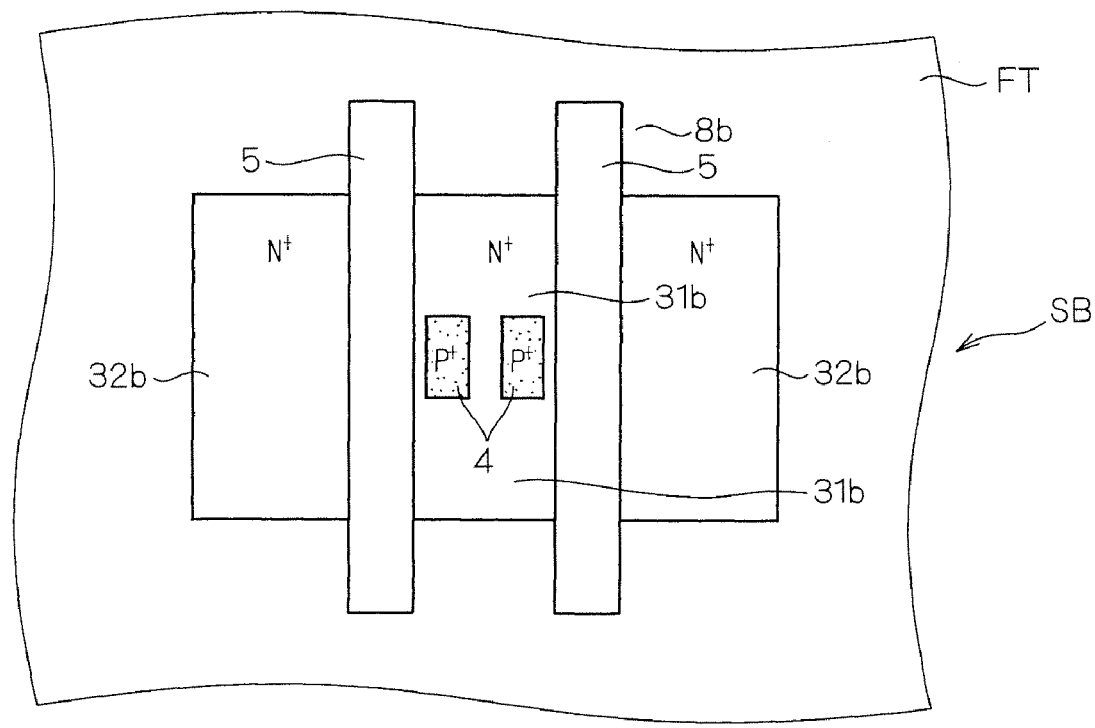
FIG. 17 is a plan view showing the constitution of a MOS transistor according to a second aspect of the embodiment 2 of the present invention.

FIG. 17 is a plan view showing the constitution of the MOS transistor 200A.

As shown in FIG. 17, the MOS transistor 200A has a constitution in which two MOS transistors are arranged in parallel in the gate length direction, two gate electrodes 5 are arranged in parallel in the gate length direction, a source region 31b doped with an N type impurity in a relatively high concentration is provided in the surface of an SOI substrate SB between the gate electrodes 5, and drain regions 32b doped with an N type impurity in a relatively high concentration are provided in the surface of the SOI substrate SB outside the gate electrodes 5 on the opposite side of the source region 31b. Therefore, according to the MOS transistor 200A, although there are two NMOS transistors arranged in parallel, they are regarded as one transistor for convenience.

In addition, the periphery of the active region is surrounded by a full trench isolation insulation film FT and electrically isolated from another semiconductor element.

In addition, source tie regions 4 in which an impurity having a conductivity type (P type in this case) opposite to that of the source region 31b is doped in a relatively high concentration are separately provided in the vicinity of the center of the two gate electrodes 5 in the gate width direction in the surface of the source region 31b.

Thus, when the constitution in which the two MOS transistors share the source region 31b is employed, the area efficiency of the transistor layout can be improved.

In addition, although the two source tie regions 4 are separately provided in the MOS transistor 200A shown in FIG. 17, the source tie region provided in the same source region and adjacent in the gate length direction may have a continuous configuration.

B-3. Third Aspect

Next, a third aspect according to the embodiment 2 of the present invention will be described with reference to a PMOS transistor P20 and NMOS transistor N20 shown in FIG. 18.

Figure 18:
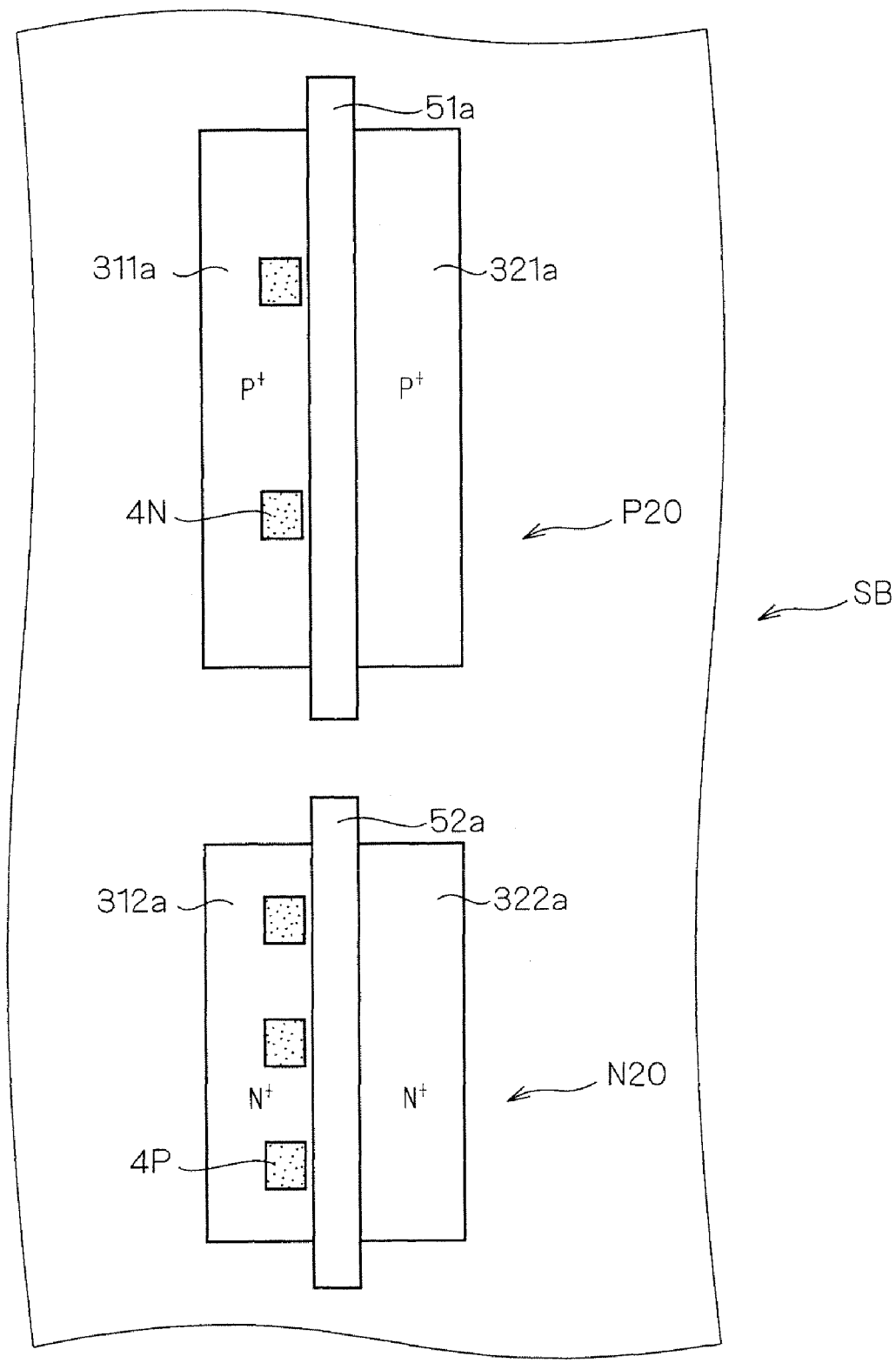
FIG. 18 is a plan view showing the constitution of a MOS transistor according to a third aspect of the embodiment 2 of the present invention.

FIG. 18 is a plan view showing the constitutions of the PMOS transistor P20 and NMOS transistor N20, in which the PMOS transistor P20 and the NMOS transistor N20 are arranged in parallel in the gate width direction.

The PMOS transistor P20 shown in FIG. 18 includes a source region 311a and a drain region 321a in the surface of an SOI substrate SB on both sides of a gate electrode 51a in the gate length direction.

Two source tie regions 4N are provided in the surface of the source region 311a so as to be spaced and aligned along the gate electrode 51a.

In addition, the NMOS transistor N20 includes a source region 312a and a drain region 322a in the surface of the SOI substrate SB on both sides of a gate electrode 52a in the gate length direction.

Three source tie regions 4N are provided in the surface of the source region 312a so as to be spaced and aligned along the gate electrode 52a.

Here, although the gate width of the gate electrode 51a of the PMOS transistor P20 is set to be longer than the gate width of the gate electrode 52a of the NMOS transistor N20, the two source tie regions 4N are provided in the source region 311a and the number of the source tie regions is smaller than that in the NMOS transistor N20 in which the three source tie regions 4P are provided in the source region 312a.

This is because since carrier mobility is small in the PMOS transistor as compared with that of the NMOS transistor, the number of carriers generated by a collisional ionization phenomenon is small and parasitic bipolar effect is not likely to be provided and kink is not likely generated and the operation withstand voltage is not likely to be lowered in the PMOS transistor, so that the interval of the source tie region 4N can be larger than that of the source tie region 4P.

Thus, when the number of the source tie regions in the PMOS transistor is set to be smaller than that of the NMOS transistor, the area efficiency can be improved in the PMOS transistor.

C. Method of Forming Source Tie Region

Next, a description will be made of a method of forming the source tie region described in the embodiments 1 and 2 of the present invention with reference to FIGS. 19 to 27 that are sectional views showing steps sequentially.

Figure 19:
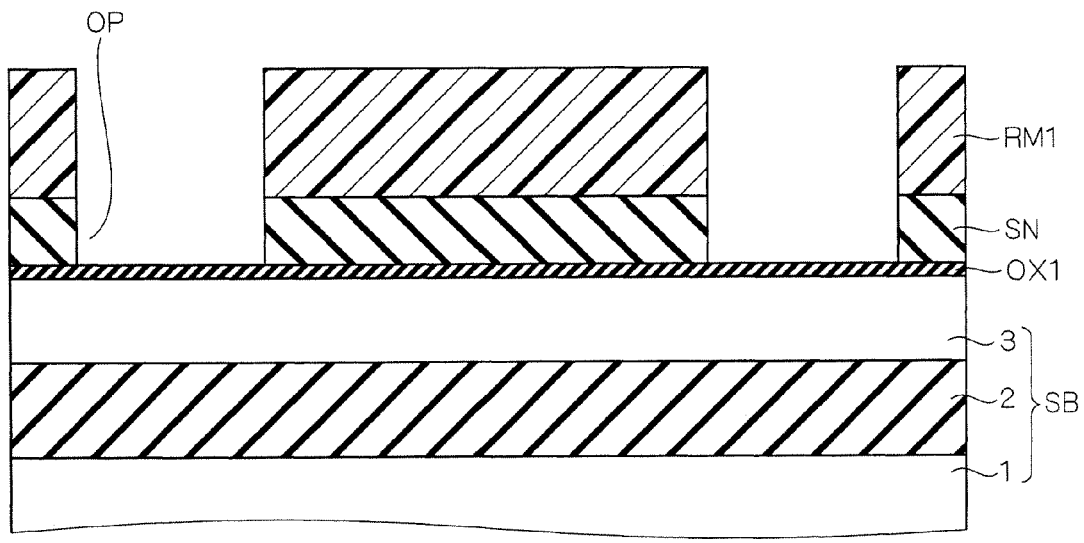

First, at a step shown in FIG. 19, the SOI substrate SB including the silicon substrate 1, the buried oxide film 2 and the SOI layer 3 and formed by a SIMOX method or a bonding method is prepared.

Then, a silicon oxide film OX1 having a thickness of several tens nm is formed by thermal oxidation and then a silicon nitride film SN having a thickness of several hundreds nm is deposited on the silicon pad OX1 by CVD (chemical vapor deposition), for example.

Then, a resist mask RM1 is patterned on the silicon nitride film SN. The resist mask RM1 has an opening for forming a trench and the silicon nitride film SN is patterned by etching using the resist mask RM1 as a mask and an opening OP is formed.

Figure 20:
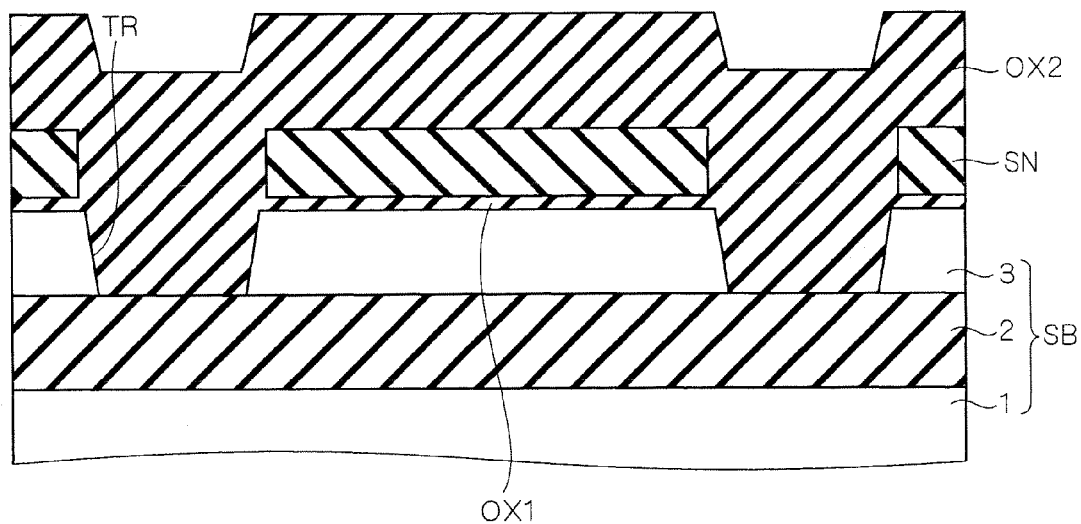
Figure 21:
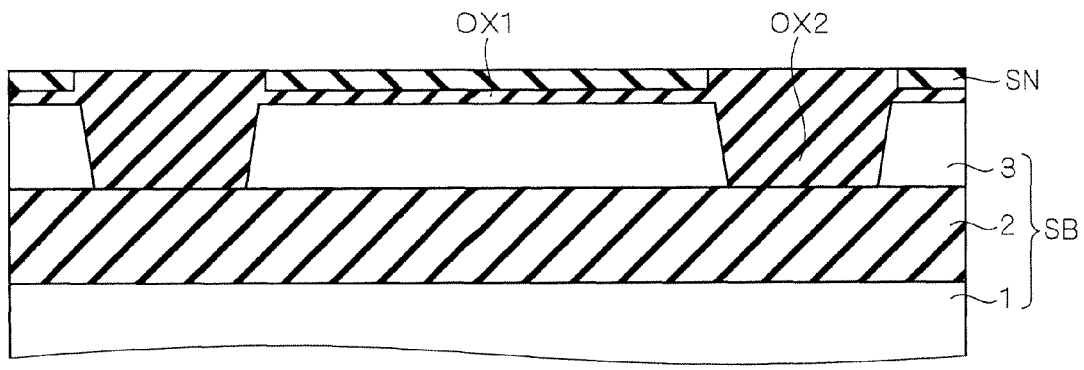

Then, an etching condition is changed and the silicon oxide film OX1 and SOI layer 3 are patterned by etching and a trench TR is formed in the SOI layer 3 as shown in FIG. 20.

Thus, the SOI layer 3 is completely etched away and the buried oxide film 2 is exposed.

Then, the resist mask RM1 is removed and then a silicon oxide film OX2 having a thickness of about 300 nm is formed over the whole region of the SOI substrate by a CVD method, for example and the trench TR is fully filled with the silicon oxide film OX2.

In addition, since the silicon oxide film OX2 is formed so as to cover the whole surface of the SOI substrate SB above the trench TR, the silicon oxide film OX2 is ground to be planarized by a CMP process until at least the surface of the silicon nitride film SN is exposed.

Figure 22:
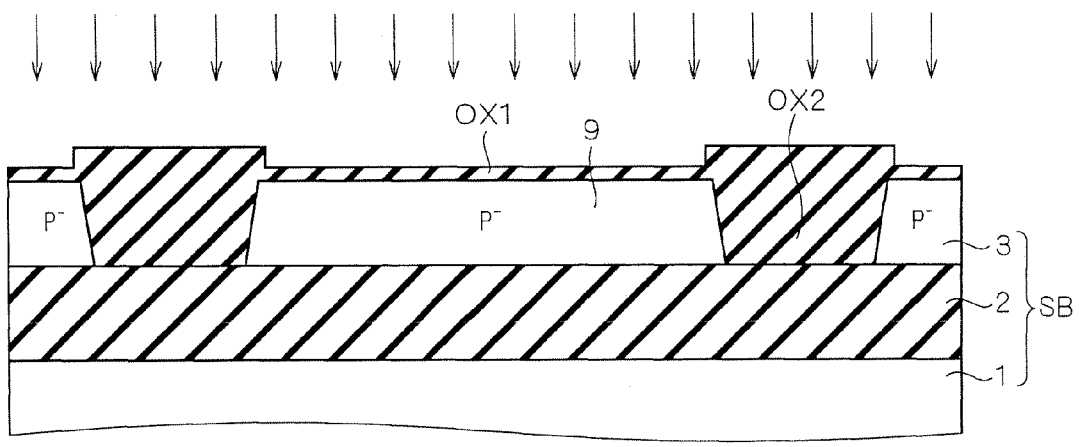

Then, the silicon nitride film SN is removed by wet etching or dry etching at a step shown in FIG. 22 and then a well region 9 is formed by well implantation.

The condition of the well implantation is such that boron (B) ion is doped at a dose of 1 to $3 \times 10^{13}/cm^2$. In addition, doping energy thereof is set at several tens keV.

In addition, in the region in which the PMOS transistor is formed, phosphorus (P) ion is doped at a dose of 1 to $3 \times 10^{13}/cm^2$, for example. In addition, the doping energy is set at several hundreds keV. Furthermore, arsenic (As) ion is doped at a dose of $1 \times 10^{11}/cm^2$ to $1 \times 10^{12}/cm^2$. In addition, the doping energy is set at several tens keV. In addition, since the step of forming the NMOS transistor is described, the well region is a P type.

Then, the full trench isolation insulation film FT is provided by removing the silicon oxide film OX1 on the SOI layer 3 and exposing the surface of the SOI layer 3.

Then, at a step shown in FIG. 23, a silicon oxide film having a few nm is formed on the SOI layer 3, for example and a polysilicon film having a thickness of several tens to several hundreds nm is formed thereon.

Then, the silicon oxide film and the polysilicon film are patterned to form the gate insulation film 7 and the gate electrode 5 on the active region defined by the full trench isolation insulation film FT.

Then, at a step shown in FIG. 24, a resist mask RM2 is patterned so as to cover at least the region on the SOI layer 3 that will become the source tie region. In this case, the resist mask RM2 may extend onto the gate electrode 5. Then, LDD is doped using the gate electrode 5 and the resist mask RM2 as masks to form the LDD region 33.

The condition when the LDD is doped is such that As ion or P ion is doped at a dose of $1 \times 10^{13}/cm^2$ to $1 \times 10^{14}/cm^2$ and the doping energy is set at several tens keV in the region in which the NMOS transistor is formed.

In addition, boron difluoride ($BF_2$) ion is doped at a dose of $1 \times 10^{13}/cm^2$ to $1 \times 10^{14}/cm^2$ in the region in which the PMOS transistor is formed. In addition, the doping energy is set at several tens keV.

Figure 25:
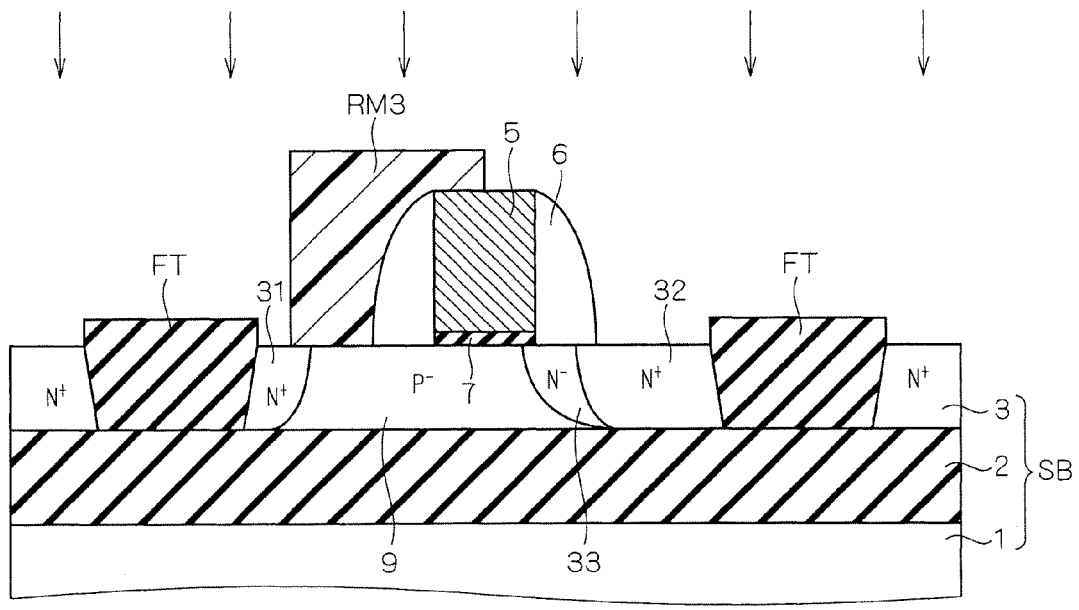

After the resist mask RM2 has been removed, a silicon oxide film having a thickness of about 50 nm is formed by the CVD method, for example on the SOI substrate SB to cover the gate electrode 5 at a step shown in FIG. 25. Then, the silicon oxide film is etched by anisotropic etching to form the sidewall insulation film 6 on the side of the gate electrode 5.

Then, a resist mask RM3 is patterned so as to cover at least the region on the SOI layer 3 in which the source tie region will be formed. In this case, the resist mask RM3 may extend onto the sidewall insulation film 6 and the gate electrode 5. Then, the source region 31 and the drain region 32 are doped using the gate electrode 5, the sidewall insulation film 6 and the resist mask RM3 as masks.

The above doping condition is such that As ion or P ion is doped at a dose of 1 to $3 \times 10^{15}/cm^2$ and the doping energy is set at several tens keV in the region in which the NMOS transistor is formed. In addition, this doping is performed in the source tie region of the PMOS transistor.

Figure 26:
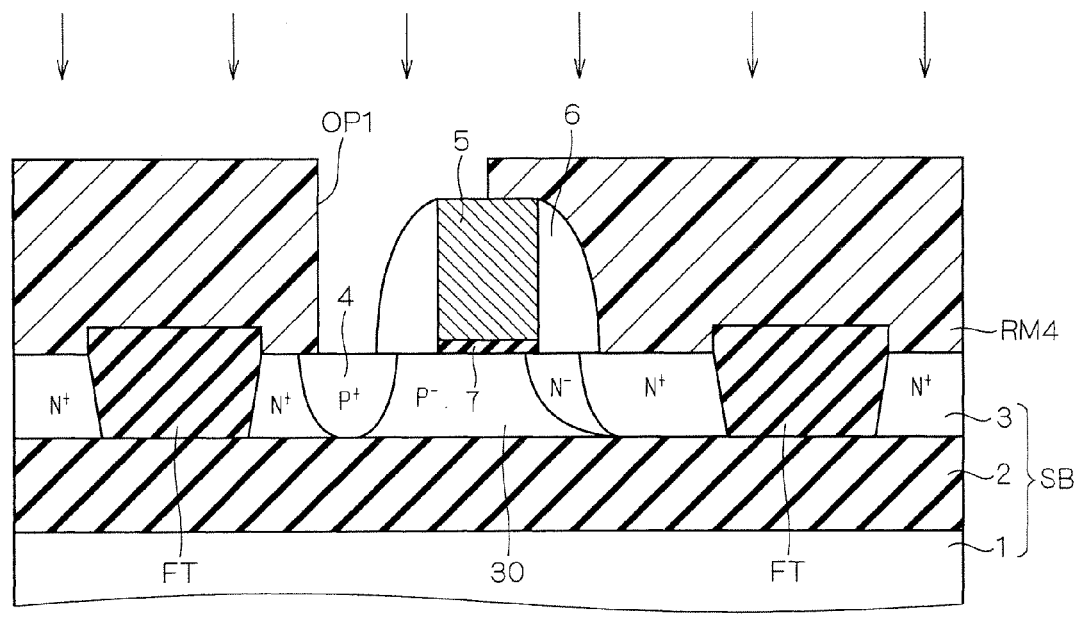

After the resist mask RM3 has been removed, a resist mask RM4 in which a region on the SOI layer 3 that will become the source tie region is at least an opening OP1 is patterned at a step shown in FIG. 26. In this case, the opening OP1 may be exposed to the sidewall insulation film 6 and the gate electrode 5. Then, the ion is doped in the SOI layer 3 through the opening OP1 to form the source tie region 4.

At this time, B ion is doped in the source tie region 4 and the source and drain regions at a dose of 1 to $3 \times 10^{15}/cm^2$ and the doping energy is set at several keV.

In addition, the condition in the source tie region is such that in the case of the NMOS transistor, the same condition as that of the source and drain regions of the PMOS transistor is set, and in the case of the PMOS transistor, the same condition as that of the source and drain regions of the NMOS transistor is set.

Finally, after the resist mask RM4 has been removed, a high melting point metal layer such as a cobalt (Co) layer or a nickel (Ni) layer is formed by sputtering so as to cover the whole SOI substrate SB at a step shown in FIG. 27 and the surfaces of the gate electrode 5 and the SOI layer 3 are silicided by the silicide reaction with silicon through a heat treatment.

Thus, the MOS transistor having the source tie region 4 in the surface of the source region 31 can be provided.

In addition, although the NMOS transistor is formed in FIGS. 19 to 27, the same steps are performed in the PMOS transistor also. However, it is to be noted that the conductivity type of the doped ion is opposite to the case of the NMOS transistor.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SOI substrate having a semiconductor substrate, a buried oxide film formed on said semiconductor substrate, and an SOI layer having a first conductivity type; and
   at least one MOS transistor provided on said SOI layer, wherein
   said at least one MOS transistor comprises:
   a source region and a drain region having a second conductivity type and selectively provided in a surface of said SOI layer;
   a body region having a first conductivity type and corresponding to said SOI layer sandwiched between said source region and said drain region;
   a gate electrode provided on said body region; and
   a plurality of semiconductor regions having a first conductivity type and provided in a surface of said source region in a vicinity of said gate electrode so as to be spaced and aligned along said gate electrode and electrically connected to said body region, wherein
   an active region comprising said source region, said drain region, and said body region is surrounded by a full isolation insulation film penetrating said SOI layer and reaching said buried oxide film, and
   said plurality of semiconductor regions are arranged such that a first distance between an end of said semiconductor regions and a nearest edge of said active region becomes half of a second distance between said semiconductor regions.

2. The semiconductor device according to claim 1, wherein
   said at least one MOS transistor comprises a plurality of MOS transistors in which respective gate electrodes are arranged in parallel in a gate length direction, and
   said plurality of MOS transistors are provided so as to share said source region between adjacent MOS transistors.

3. The semiconductor device according to claim 2, wherein
   said semiconductor region within an electrode region provided in said source region shared by said adjacent MOS transistors are provided so as to continuously extend between said gate electrodes.

4. The semiconductor device according to claim 1, wherein
   said at least one MOS transistor comprises an N channel MOS transistor in which said first conductivity type is a P type and said second conductivity type is an N type, and a P channel MOS transistor in which said first conductivity type is an N type and said second conductivity type is a P type,
   said at least one semiconductor region within an electrode region in said N channel MOS transistor and said P channel MOS transistor comprises a plurality of semiconductor regions within said electrode region arranged so as to be space and aligned along said gate electrode, and
   a distance between said semiconductor regions within said electrode region in said N channel MOS transistor is set so as to be smaller than a distance between said semiconductor regions within said electrode region in said P channel MOS transistor.

5. The semiconductor device according to claim 1, further comprising:
   a front semiconductor region having a first conductivity type and selectively provided in a surface of said SOI layer and extending from a side of said semiconductor region within an electrode region on said drain region side, to said gate electrode lower part, wherein
   an impurity concentration of said front semiconductor region is set to be higher than that of said SOI layer and lower than that of said semiconductor region within said electrode region.

6. The semiconductor device according to claim 1, wherein both ends of said gate electrode are extended on said full isolation insulation film.

7. The semiconductor device according to claim 1, wherein a silicide layer is provided on said source region and said semiconductor regions.

8. The semiconductor device according to claim 1, wherein a potential of said source region is identical to a potential of said semiconductor regions.

* * * * *